United States Patent [19]

Inoue et al.

[11] Patent Number: 5,838,186

[45] Date of Patent: Nov. 17, 1998

[54] SIGNAL OUTPUT CIRCUIT WITH REDUCED NOISE IN OUTPUT SIGNAL

[75] Inventors: Osamu Inoue; Osamu Ara, both of Hyogo, Japan

[73] Assignee: Mitsubishi Denki Kabushiki Kaisha, Tokyo, Japan

[21] Appl. No.: 880,071

[22] Filed: Jun. 20, 1997

Related U.S. Application Data

[63] Continuation of Ser. No. 726,737, Oct. 7, 1996, abandoned, which is a continuation of Ser. No. 487,209, Jun. 7, 1995, abandoned.

[30] Foreign Application Priority Data

Sep. 21, 1994 [JP] Japan .................................... 6-226139

[51] Int. Cl.⁶ .................................................. H03K 5/01
[52] U.S. Cl. .......................... 327/389; 327/170; 327/374; 327/381; 327/387; 327/391; 326/27; 326/82
[58] Field of Search .................................... 327/108, 170, 327/374, 379, 380, 381, 382, 384, 387, 389, 391, 427, 434, 437; 326/17, 20, 23, 24, 27, 87

[56] References Cited

U.S. PATENT DOCUMENTS

| 4,377,756 | 3/1983 | Yoshihara et al. ..................... 327/566 |
|---|---|---|
| 4,572,972 | 2/1986 | Shoji ........................................ 327/566 |
| 4,719,369 | 1/1988 | Asano et al. .............................. 326/30 |
| 4,829,199 | 5/1989 | Prater ........................................ 326/27 |
| 4,959,565 | 9/1990 | Knecht et al. .......................... 327/310 |
| 5,036,232 | 7/1991 | Jungert et al. .......................... 327/180 |
| 5,111,075 | 5/1992 | Ferry et al. ............................... 326/27 |
| 5,122,690 | 6/1992 | Bianchi .................................... 326/27 |
| 5,329,175 | 7/1994 | Peterson .................................... 326/85 |
| 5,424,653 | 6/1995 | Folmsbee et al. ........................ 326/26 |

FOREIGN PATENT DOCUMENTS

2-14616  1/1990  Japan ..................................... 326/87

*Primary Examiner*—Terry Cunningham
*Attorney, Agent, or Firm*—McDermott, Will & Emery

[57] ABSTRACT

An additional MOS transistor receiving at its control electrode a signal complementary to that applied to control electrodes of MOS transistors is provided between a power supply node and a control electrode line formed by resistors having a significant resistance and interconnecting respective control electrodes of MOS transistors which are connected in parallel and each of which is connected between output signal line and power supply node. When MOS transistors are rendered non-conductive, the additional MOS transistor is rendered conductive. As a result, internal nodes are driven by an inverter and the additional MOS transistor to a power supply voltage, thereby turning off MOS transistors at the same timing. Consequently, through current in a semiconductor output circuit can be suppressed and an output signal has no ringing.

10 Claims, 14 Drawing Sheets

SIGNAL OUTPUT CIRCUIT WITH REDUCED NOISE IN OUTPUT SIGNAL

This application is a continuation of application Ser. No. 08/726,737 filed Oct. 7, 1996, now abandoned, which is a continuation of application Ser. No. 08/487,209, filed Jun. 7, 1995, now abandoned.

BACKGROUND OF THE INVENTION

1. Field of the Invention

The present invention relates to semiconductor circuits, and particularly to a semiconductor circuit responsive to an input signal for outputting a signal at a logic level corresponding to that of the input signal. More specifically, the present invention relates to an output circuit included in a semiconductor integrated circuit.

2. Description of the Background Art

FIG. 11 shows a structure of a conventional output circuit. In FIG. 11, the conventional output circuit includes p channel MOS transistors P1–P5 connected in parallel with each other between a power supply node 1 for providing a first power supply potential Vcc as a first reference potential and an output signal line 5 connected to an output terminal 4; n channel MOS transistors N1–N5 connected in parallel with each other between a ground node 2 for providing a ground potential GND as a second reference potential and output signal line 5; resistors R1–R4 connected between respective gate electrodes as control electrodes of p channel MOS transistors P1–P5; and resistors R5–R8 connected between respective gate electrodes of n channel MOS transistors N1–N5. Resistors R1–R4 are connected in series and each has one end connected to the gate electrode of the p channel MOS transistor in a previous stage and the other end connected to the gate electrode of the p channel MOS transistor in a subsequent stage. Similarly, resistors R5–R8 are connected in series and each has one end connected to the gate electrode of the n channel MOS transistor in a previous stage and the other end connected to the gate electrode of the n channel MOS transistor in a subsequent stage.

The conventional output circuit further includes an inverter A1 for inverting an input signal IN1 applied from an input node 3, which in turn receives an input signal IN, through a node 3a and applying the inverted signal to resistors R1–R4, and an inverter A2 for inverting an input signal IN2 applied from input node 3 through an input node 3b and applying the inverted signal to resistors R5–R8. Although input signals IN1 and IN2 are the same signal, they are denoted by different reference characters for simplicity of description. Now, operation of the output circuit shown in FIG. 11 will be described below with reference to FIG. 12 which shows operation waveforms thereof.

When input signal IN is at an L (Low) level, inverter A1 drives nodes INA1–INA5 to an H (High) level and p channel MOS transistors P1–P5 are all turned off. Inverter A2 drives nodes INB1–INB5 to an H level, to turn on all n channel MOS transistors N1–N5 which in turn drive output signal line 5 and output node 4 to an L level of ground potential GND.

When input signal IN (IN1 and IN2) rises to an H level, output signals of inverters A1 and A2 fall to an L level. At this time, resistors R1–R4 function as delay elements, to sequentially delay and transmit the output signal of inverter A1. Similarly, resistors R5–R8 function as delay elements, to sequentially delay and transmit the output signal of inverter A2. As a result, the potential levels of nodes INA1 and INB1 fall to an L level, turning on p channel MOS transistor P1 and turning off n channel MOS transistor N1. At this time, p channel MOS transistors P2–P4 are still in an off state and n channel MOS transistors N2–N4 are still in an on state. In this state, output signal line 5 is charged by power supply node 1 through p channel MOS transistor P1.

After a prescribed time period has lapsed, the potentials of nodes INA2 and INB2 fall to an L level, thereby turning on p channel MOS transistor P2 and turning off n channel MOS transistor N2. Consequently, output signal line 5 is charged through p channel MOS transistors P1 and P2, raising a signal DOUT which is output from an output node. Similarly, nodes INA3 and INB3 fall to an L level, followed by nodes INA4 and INB4, and then nodes INA5 and INB5 sequentially falling to an L level. The p channel MOS transistors P3–P5 are rendered conductive in this sequence and n channel MOS transistors N3–N5 are sequentially turned off. As a result, output signal line 5 is rapidly charged by MOS transistors P1–P5, so that output signal DOUT rises to an H level.

When input signal IN falls from an H level to an L level, inverters A1 and A2 drive the voltage levels of internal nodes INA1 and INB1 to an H level, p channel MOS transistor P1 is rendered non-conductive, and n channel MOS transistor N1 is rendered conductive. Output signal line 5 is discharged through n channel MOS transistor N1 and the potential thereof is slightly decreased. The potentials of nodes (INA2, INB2), (INA3, INB3), (INA4, INB4) and (INA5, INB5) sequentially attain an H level, n channel MOS transistors N2–N5 are sequentially rendered conductive, and p channel MOS transistors P2–P5 are sequentially turned off. As a result, output signal line 5 is discharged by the progressively increasing current and finally discharged at the level of ground potential GND.

In the structure of the output circuit shown in FIG. 11, one p channel MOS transistor is divided into five p channel MOS transistors and the output node is charged by sequentially turning on the divided p channel MOS transistors, and similarly one n channel MOS transistor is divided into five n channel MOS transistors in order to discharge the output signal line with progressive current flow. By thus driving the output signal line and the output node with progressively enhanced drivability, the following effects can be achieved.

As shown in FIG. 13, a power supply line 1a providing power supply voltage Vcc to power supply node 1 has an inductive load (parasitic inductance) due to the output circuit, and a ground line 2a supplying a ground voltage to ground node 2 also has a similar inductive load (parasitic inductance) L2. A signal line from output node 4 to an output pad (including a lead frame) also has an inductive load L3 and a parasitic capacitance C resulting from an external load and an interconnection line capacitance. If the current supply capability of MOS transistors P and N is enhanced so as to drive (charge/discharge) output node 4 (4a) at a high speed, the following problems arise.

A resonance circuit is formed between power supply line 1a and output node 4a by inductances L1 and L3 and capacitance C, and another resonance circuit is formed between ground line 2a and output node 4a by inductances L2 and L3 and capacitance C. When input signal IN increases to an H level with the potential of node 4 at an H level, n channel MOS transistor N is rendered conductive and discharges nodes 4 and 4a to the ground potential level with its high current supply capability. This discharging corresponds to the discharging from load capacitance C (parasitic capacitance) to the ground potential level through inductances L3 and L2. Therefore, a great change in current flow suddenly occurs in the inductance and potential of output node 4a falls below the ground potential due to the large driving current. As a result, the so-called undershoot is generated, which further causes a ringing at output nodes 4 and 4a. The ringing at output node 4 is more intense if the change in current is greater. This is because a voltage V generated at the inductance can be expressed as V=−L·di/dt, where L denotes inductance of an inductive load and di/dt denotes a change in current i with time.

Similarly, when input signal IN falls from an H level to an L level thereby rendering p channel MOS transistor P conductive and n channel MOS transistor N non-conductive, a large driving current flows to capacitance C and the potential of node 4 rises above the power supply voltage Vcc level. Such an overshoot causes a ringing at node 4. If such a ringing is generated, the logic level of output node 4 is not settled until the ringing is stabilized. Consequently, the signal output timing thereof is delayed until the ringing is stabilized, thereby preventing fast output of the signal.

Upon generation of an overshoot or an undershoot, a large induced voltage is generated by inductive load L1 or L2 of power supply line 1a or ground line 2a. Consequently, power supply voltage Vcc or ground voltage GND varies, leading to a change in input/output signal level of other circuits utilizing the voltage of power supply line 1a or ground line 2a, whereby malfunction may possibly occur in other circuits.

As described above, p channel MOS transistors P1–P5 or n channel MOS transistors N1–N5 having a relatively low current driving ability are sequentially rendered conductive, instead of rapidly driving the output node with a high driving ability, thereby preventing a rapid change in current and therefore preventing a ringing due to an overshoot or an undershoot. More specifically, output node 4 is charged or discharged initially with a relatively low current driving ability and then, when the potential of output node 4 has changed to a level at which ringing will not be generated any longer even by driving the node at a high speed, output node 4 is charged or discharged at a high speed by turning on all the transistors. The generation timing of the output signal can thus be prevented from delaying while suppressing generation of a ringing.

FIGS. 15A and 15B show a planar layout of the p channel MOS transistor portion of the output circuit shown in FIG. 11 and an equivalent circuit thereof, respectively. In FIG. 15A, active regions (impurity regions) are arranged at a distance from one another in a field active region F. Drain regions D (D1–D3) and source regions S (S1–S3) are alternately arranged. Gate electrodes GA1–GA5 are each arranged between drain region D and source region S. In other words, two adjacent p channel MOS transistors share one impurity region in field active region F. Gate electrodes GA1–GA5 are interconnected by a gate electrode interconnection G and constitute one gate electrode. Source regions S1–S3 are connected to a power supply line V through a contact hole CHs, and drain regions D1–D3 are connected to an output signal line DT through a contact hole CHd. Output signal line DT and power supply line V are usually formed of an aluminum interconnection layer with low resistance, and gate electrode interconnection G is formed of polysilicon with relatively high resistance.

Referring to FIG. 15B, gate electrodes GA1–GA5 each have a resistance R1 and the gate electrode interconnection portion connecting adjacent gate electrodes each have a resistance R2. Gate electrodes interconnection G interconnects all the gate electrodes GA1–GA5, and thus it is equivalent to a longer gate interconnection. A delay is generated in propagation of input signal IN due to parasitic capacitance and interconnection resistance of gate electrode interconnection G, whereby MOS transistors P1–P5 have different turning-on timings.

As the signal propagation delay at gate electrode interconnection G becomes greater, output node 4 is driven more moderately, so that all the MOS transistors are rendered conductive after the potential of node 4 has changed sufficiently, thereby suppressing generation of a noise such as a ringing.

An interconnection layout for n channel MOS transistors N1–N5 can be obtained by substituting a ground line transmitting ground voltage GND for power supply line V transmitting power supply voltage Vcc in the interconnection layout for p channel MOS transistors shown in FIGS. 15A and 15B.

The conventional output circuit, however, gives rise to the following problems.

More specifically, as can be seen from operation waveforms in FIG. 12, when nodes INA1 and INB1 both attain an L level at a time Tj, internal nodes INA3, INB3–INA5, INB5 are still at an H level. As a result, p channel MOS transistor P1 turns on when n channel MOS transistors N3–N5 are on. Therefore, current flows from p channel MOS transistor P1 through n channel MOS transistors N3–N5 to the ground potential level. As a result, the consumed current amount is increased and power supply voltage Vcc of power supply node 1 is discharged, thereby varying the level of power supply voltage Vcc and generating a noise. Current also flows to ground node 2 and the voltage level of ground voltage GND rises, thereby generating a noise on the ground voltage.

A similar problem arises when input signal IN falls from an H level to an L level. When nodes INA1 and INB1 are both at an H level at a time Th, nodes INA3, INB3–INA5, INB5 are still at an L level, n channel MOS transistor N1 is turned on and p channel MOS transistors P3–P5 are on. A noise is similarly generated at power supply voltage Vcc and ground voltage GND, and consumed current amount is increased by through current.

If a resistance of gate electrode interconnection G is made higher in order to reduce the noise of the output signal, resistance R2 of the gate electrode connection portion in FIG. 15B must be made higher. In this case, this portion must be made longer because the gate electrode interconnection layer is formed of polysilicon. As a result, the pattern area for the gate electrode interconnection is increased, leading to an increase in the area occupied by the output circuit.

If the signal propagation delay of the gate electrode interconnection is reduced by lowering resistance R1 of the gate electrode interconnection in order to achieve high speed operation of a semiconductor integrated circuit including the above mentioned output circuit, gate electrode interconnection layer G must be longer so as to obtain sufficient values of resistances R1 and R2 of the gate electrode interconnection shown in FIG. 15B. Therefore, the area occupied by the gate electrode interconnection and the like is also increased even with this approach.

SUMMARY OF THE INVENTION

An object of the present invention is to provide a semiconductor circuit which allows stable generation of an output signal with small occupied area and reduced current consumption.

Briefly speaking, the present invention relates to an output circuit including a plurality of transistor elements connected in parallel to each other for driving an output node, in which these transistors have different conduction timings when they are turned on while having a same common conduction timings when these MOS transistors are turned off.

The plurality of transistors have different conduction timings to gradually increase driving ability when it is necessary to drive an output node, while these transistors are turned off simultaneously when it is not necessary to drive the output node. As a result, a rapid change in current will not occur at the output node, and thus preventing generation of a ringing or the like.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, embodiments of the present invention will be described with reference to the drawings. The present invention can be applied to any of the output circuits including an output circuit for externally outputting a signal through an output terminal connected to a pad, a circuit in a semiconductor device having a buffer function for driving an output signal line thereof or a particular signal line to a logic level corresponding to that of an internal signal in response to an input signal, and an output circuit provided in an output stage of a semiconductor circuit in a semiconductor device including a plurality of semiconductor circuits formed on the same semiconductor chip. A voltage level of a signal outputted from a semiconductor circuit in accordance with the present invention is not limited to a power supply potential Vcc and a ground voltage GND, and it can be any voltage level including a high voltage Vpp higher than power supply voltage Vcc, a negative voltage Vbb lower than ground voltage GND and a reference voltage Vref such as an intermediate voltage. For convenience, the semiconductor circuit in accordance with the present invention will be described as a circuit for outputting a signal which has an amplitude between power supply voltage Vcc and ground voltage GND.

[Embodiment 1]

Figure 1A:
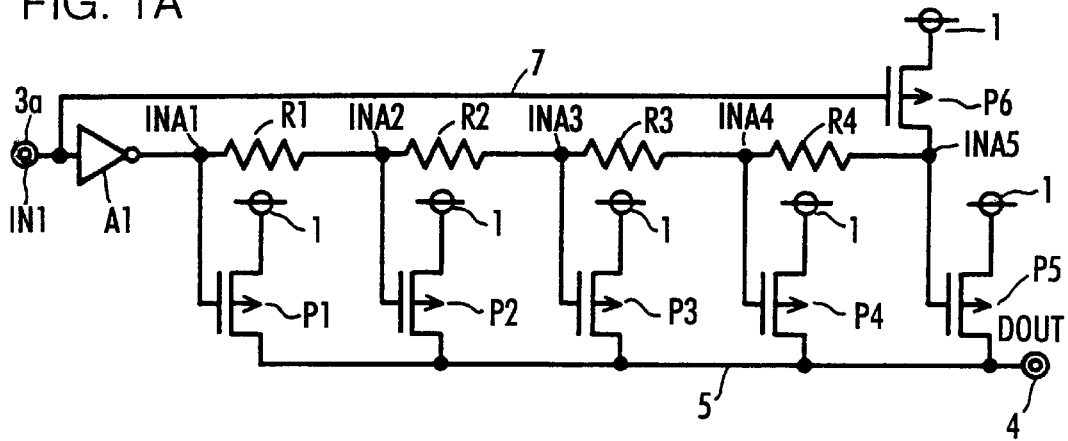
FIGS. 1A and 1B show a structure and operation of a semiconductor circuit in accordance with a first embodiment of the present invention, respectively.
Figure 1B:
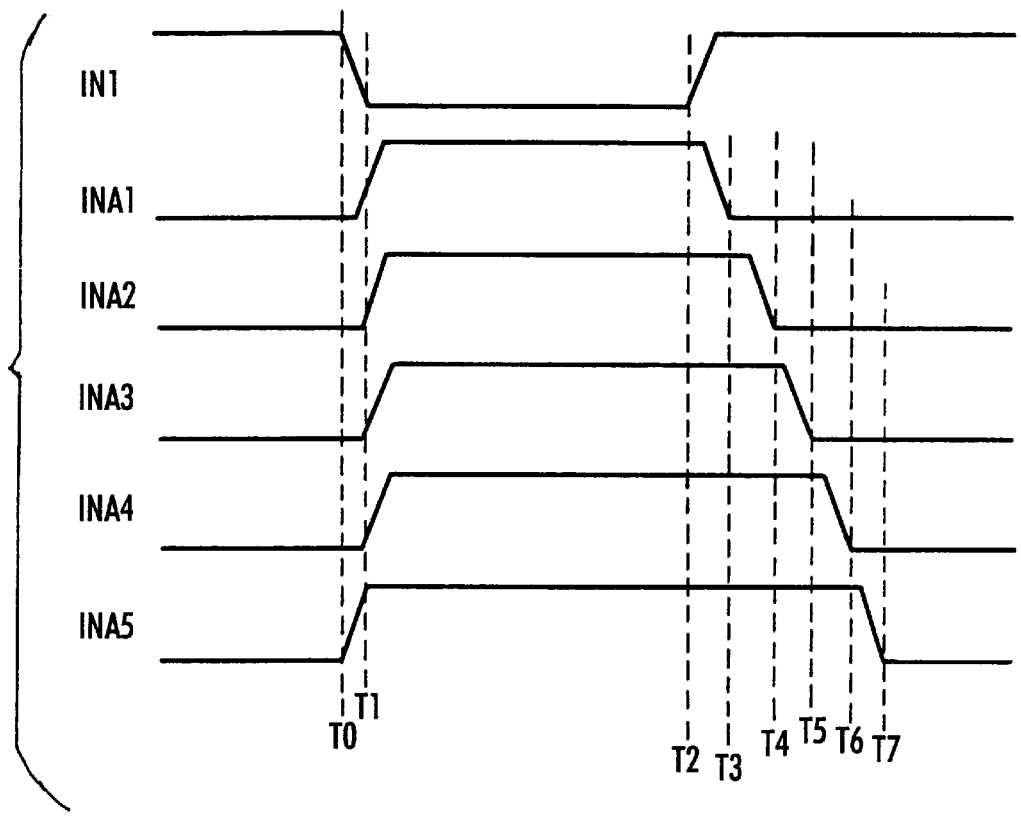

FIGS. 1A and 1B show a structure and operation waveforms of a semiconductor circuit in accordance with a first embodiment of the present invention. FIG. 1A shows a portion of the circuit driving an output node 4 to power supply potential Vcc through an output signal line 5.

As shown in FIG. 1A, the semiconductor circuit includes a plurality (five in this embodiment) of p channel MOS transistors (insulated gate type field effect transistors) P1–P5 connected in parallel to each other between a power supply node 1 and output signal line 5 connected to output node 4; a plurality (four in this embodiment) of resistors R1–R4 connected in series and between respective gate electrodes (control electrodes) of the plurality of p channel MOS transistors P1–P5; an inverter A1 for inverting an input signal IN1 applied to an input node 3a and transmitting the inverted signal to an internal node INA1; and a p channel MOS transistor P6 for electrically connecting power supply node 1 and internal node INA5 in response to input signal IN1 applied to internal node 3a. MOS transistors P1–P5 have their gate electrodes connected to internal nodes INA1–INA5, and resistors R1–R4 are serially connected between internal nodes INA1–INA5. More specifically, resistor R1 is connected between internal nodes INA1 and INA2, resistor R2 is connected between internal nodes INA2 and INA3, resistor R3 is connected between internal nodes INA3 and INA4, and resistor R4 is connected between internal nodes INA4 and INA5.

The p channel MOS transistor P6 receives input signal IN1 at its gate electrode from internal node 3a through an interconnection 7 of low resistance formed of aluminum or the like. In other words, p channel MOS transistor P6 and p channel MOS transistors P1–P5 receive signals opposite in phase (at different logic levels) to each other at the gate electrodes thereof. Operation of the semiconductor circuit shown in FIG. 1A will be described below with reference to FIG. 1B showing operation waveforms thereof.

When input signal IN1 is at an H level, MOS transistor P6 is in a non-conductive state, input nodes INA1–INA5 are at an L level by an output signal of inverter A1, and MOS transistors P1–P5 are in a conductive state. In this state, output signal line 5 and output node 4 are charged up to a power supply voltage Vcc level through MOS transistors P1–P5. When input signal IN1 falls from an H level to an L level at time T0, an output signal of inverter A1 (the potential of input node INA1) rises from an L level to an H level. At this time, MOS transistor P6 is rendered conductive by receiving input signal IN1 at the gate electrode thereof through internal interconnection 7, thereby charging internal node INA5 to the power supply potential Vcc level. If current driving ability (for example, a ratio W/L between a channel width W and a channel length L) of MOS transistor P6 is set at an appropriate value, internal nodes INA1–INA5 are rapidly charged to the power supply potential Vcc level by inverter A1 and MOS transistor P6. Consequently, the voltage levels of internal nodes INA1–INA5 all attain an H level substantially at time T1, thereby turning off all MOS transistors P1–P5 substantially at time T1. As a result, a current path from power supply node 1 to output signal line 5 and output node 4 is shut off rapidly when MOS transistors P1–P5 are rendered non-conductive.

When input signal IN1 rises from an L level to an H level at time T2, MOS transistor P6 is rendered non-conductive by receiving a signal of an H level at the gate electrode thereof through internal interconnection 7, and internal node INA5 is disconnected from power supply node 1. When inverter A1 inverts input signal IN1 applied to internal node 3a and transmits the inverted signal to input node INA1, the potential level of input node INA1 falls to an L level at time T3, thereby turning on MOS transistor P1. Here, inverter A1 is shown to provide a significant delay time in FIG. 1B. The signal applied to internal node INA1 is transmitted to internal node INA2 through resistor R1. The signal at internal node INA1 is delayed for a prescribed time period before transmitted to internal node INA2 due to resistance of resistor R1 and interconnection capacitance (parasitic capacitance) between internal nodes INA1 and INA2.

More specifically, after a prescribed time period has lapsed from time T3, the potential of internal node INA2 falls to an L level at time T4, thereby turning on MOS transistor P2. At time T4, output signal line 5 is charged by MOS transistors P1 and P2 and charging current thereof increases. Thereafter, the potentials of internal nodes INA3, INA4 and INA5 fall to an L level by resistors R2, R3 and R4 at time T5, T6 and T7, respectively, thereby turning on MOS transistors P3, P4 and P5 in this sequence. As a result, output signal line 5 and output node 4 are charged by the progressively increasing charging current and the potentials thereof moderately increase, resulting in reliable suppression of a ringing (an overshoot) at output node 4.

In the above-described structure, all MOS transistors P1–P5 for driving the output signal line are simultaneously rendered non-conductive at a high speed but are sequentially rendered conductive, thereby achieving a semiconductor circuit which can suppress generation of a ringing with a small power consumption.

In accordance with the structure shown in FIG. 1A, MOS transistor P6 is located at internal node INA5 at which delay of a gate signal (the output signal of inverter A1 applied to each gate electrode of MOS transistors P1–P5) is the greatest. However, a plurality of MOS transistors P6 can be arranged at appropriate internal nodes.

[Modification 1]

Figure 2A:
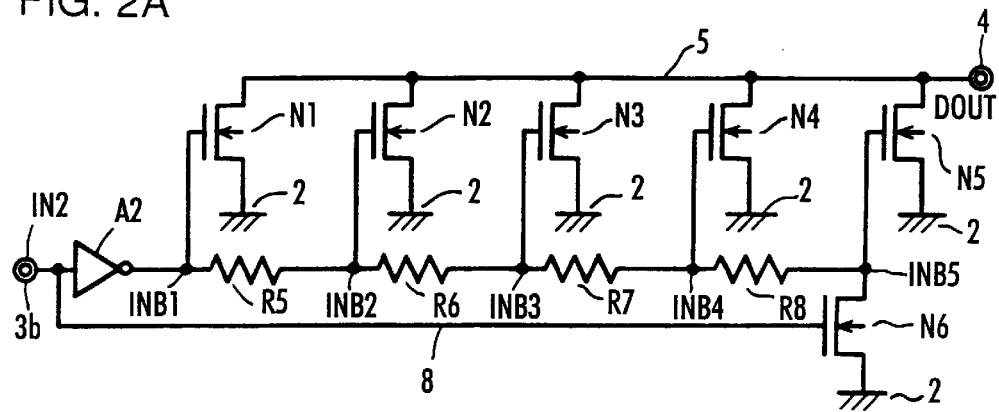
FIGS. 2A and 2B show a structure and operation of a first modification of a first embodiment in accordance with the present invention, respectively.
Figure 2B:
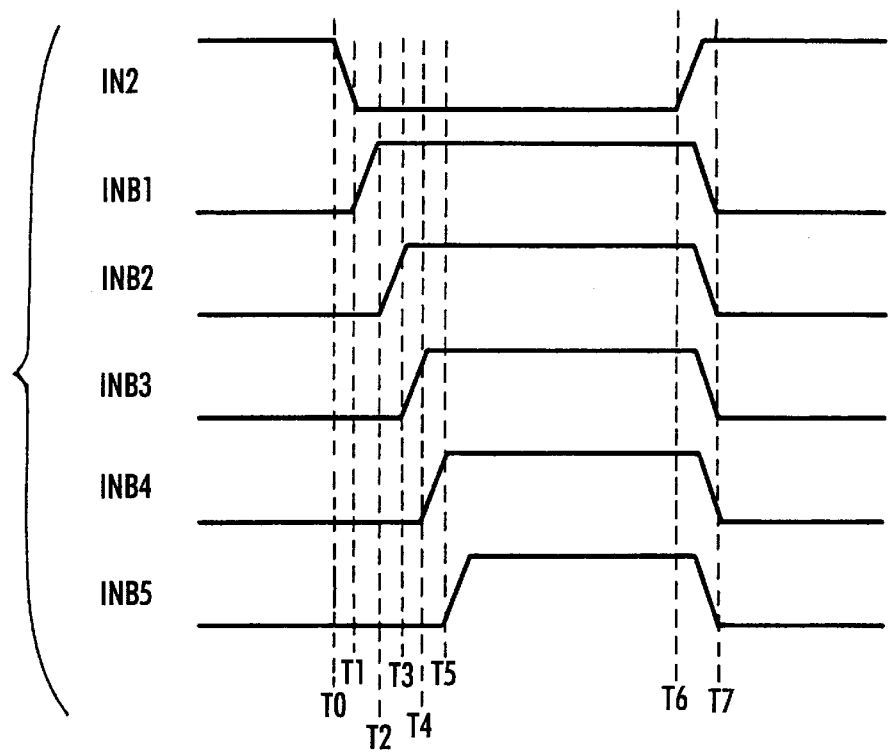

FIGS. 2A and 2B show a structure and operation waveforms in accordance with a first modification of a semiconductor circuit in the first embodiment of the present invention.

In FIG. 2A, a semiconductor circuit includes a plurality (five in this modification) of n channel MOS transistors N1–N5 connected in parallel to each other between output signal line 5 and a ground node 2; a plurality (four in this modification) of resistors R5–R8 connected in series between respective gate electrodes of MOS transistors N1–N5; an inverter A2 for inverting an input signal IN2 applied to an input node 3b and transmitting the inverted signal to an internal node INB1; and an n channel MOS transistor N6 connected between an internal node INB5 and ground node 2 for electrically connecting internal node INB5 to ground node 2 in response to input signal IN2 transmitted through an internal interconnection 8.

Internal interconnection 8 is formed of a conductor having a relatively low resistance, such as aluminum. MOS transistors N1–N5 have their gate electrodes connected to internal nodes INB1–INB5, respectively. Resistor R5 is connected between internal nodes INB1 and INB2, resistor R6 is connected between internal nodes INB2 and INB3, resistor R7 is connected between internal nodes INB3 and INB4, and resistor R8 is connected between internal nodes INB4 and INB5. Operation of the semiconductor circuit shown in FIG. 2A will be described below with reference to FIG. 2B which shows operation waveforms thereof.

When input signal IN2 is at an H level, MOS transistor N6 is rendered conductive by an H level signal received at its gate electrode through internal interconnection 8. Inverter A2 inverts signal IN2 at input node 3b and transmits the inverted signal to internal node INB1. As a result, all internal nodes INB1–INB5 are at an L level, and MOS transistors N1–N5 are all rendered non-conductive.

When input signal IN2 falls from an H level to an L level at time T0, the output signal of inverter A2 (the potential of node INB1) rises from an L level to an H level at time T1 (here, inverter A2 is assumed to have a significant delay time). Input signal IN2 is also applied to the gate electrode of MOS transistor N6 through internal interconnection 8 of a low resistance, and MOS transistor N6 is rendered non-conductive in response to the fall of input signal IN2. In response to the rise of the potential of node INB1, MOS transistor N1 is rendered conductive and discharges output signal line 5 to the ground potential level. The potential of node INB2 rises from an L level to an H level at time T2 due to RC delay of resistor R5 and the parasitic capacitance, and MOS transistor N2 is rendered conductive. Consequently, output signal line 5 is discharged to the ground potential level by MOS transistors N1 and N2.

The potentials of internal nodes INB3, INB4 and INB5 are raised from an L level to an H level by resistors R6, R7 and R8 at time T3, T4 and T5, thereby turning on MOS transistors N3, N4 and N5 in sequence. As a result, the discharging current of output signal line 5 gradually increases and output signal line 5 is discharged. Since the discharging current of output signal line 5 is gradually increased and MOS transistors N1–N5 are all rendered conductive and discharge output signal line 5 with high current driving ability after the potential of the output node has fallen to a level where a ringing is not generated, generation of a ringing (an undershoot) at output node 4 can be prevented.

When input signal IN2 rises from an L level to an H level at time T6, the potential of the gate electrode of MOS transistor N6 rapidly rises to an H level through internal interconnection 8 having a low resistance, and MOS transistor N6 is rendered conductive. Inverter A2 drives internal node INB1 to an L level. Since internal nodes INB1–INB5 are driven to an L level of the ground potential level by inverter A2 and MOS transistor N6, gate nodes INB1–INB5 fall to an L level substantially at the same time T7, so that MOS transistors N1–N5 are all rendered non-conductive at the same timing.

As described above, in the path for discharging the output node to the ground potential level, n channel MOS transistors are rendered conductive sequentially and rendered non-conductive rapidly and substantially at the same timing, so that generations of an undershoot and through current can be completely prevented.

In the structure shown in FIG. 2A, MOS transistor N6 for driving an internal node is provided only for internal node INB5 at which the delay time is the greatest. A plurality of MOS transistors N6 can be arranged in parallel to each other at appropriate locations.

FIGS. 1A and 2A show structures which individually suppress generation of an overshoot and an undershoot, respectively. These circuits can be independently applied to a circuit portion where an overshoot would be a critical factor and a circuit portion where a ringing due to an undershoot would be a critical factor, respectively.

[Modification 2]

Figure 3A:
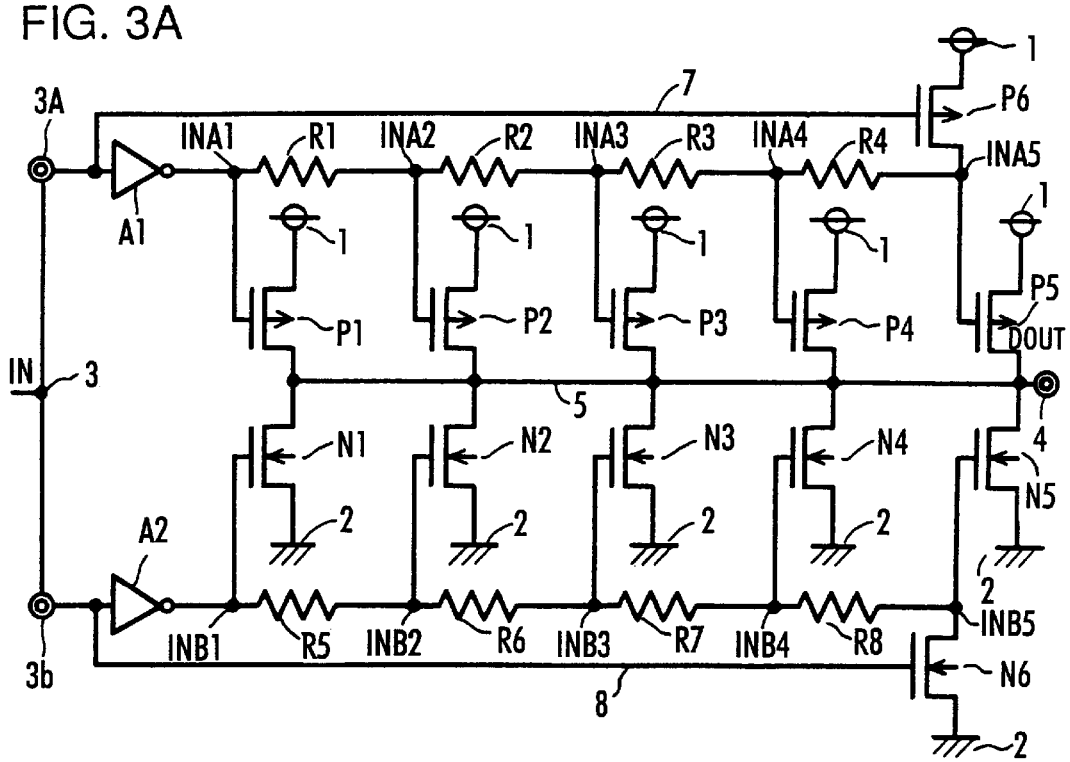
FIGS. 3A and 3B show a structure and operation of a second modification of a first embodiment of the present invention.
Figure 3B:
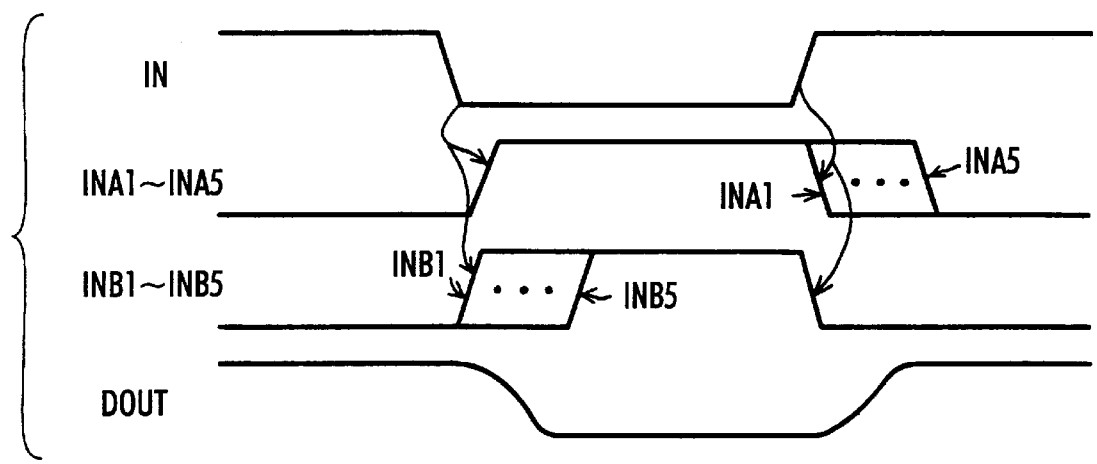

FIGS. 3A and 3B show a second modification of the first embodiment in accordance with the present invention. In FIG. 3A, a semiconductor circuit includes p channel MOS transistors P1–P5 connected in parallel with each other between power supply node 1 and output signal line 5; n channel MOS transistors N1–N5 connected in parallel with each other between ground node 2 and output signal line 5; resistors R1–R4 connected in series and between respective gate electrodes of MOS transistors P1–P5; resistors R5–R8 connected in series and between respective gate electrodes of MOS transistors N1–N5; a p channel MOS transistor P6 for supplying current from power supply node 1 to internal node INA5 in response to input signal IN applied to internal node 3; an n channel MOS transistor N6 for electrically connecting internal node INB5 to ground node 2 in response to the input signal applied to internal node 3; and inverters A1 and A2 for inverting input signal IN applied to internal node 3 and outputting the inverted signal to internal nodes INA1 and INB1, respectively.

The structure of the semiconductor circuit shown in FIG. 3A is equivalent to a combination of the semiconductor circuits in FIGS. 1A and 2A. Operation of the semiconductor circuit shown in FIG. 3A will be described below with reference to FIG. 3B which shows operation waveforms thereof.

When input signal IN is at an H level, MOS transistor P6 is in a non-conductive state and MOS transistor N6 is in a conductive state. Internal nodes INA1–INA5 and INB1–INB5 are all at an L level. In this state, p channel MOS transistors P1–P5 are in a conductive state, n channel MOS transistors N1–N5 are in a non-conductive state, and output signal DOUT which is outputted from output signal line 5 through output node 4 is at an H level.

When input signal IN falls from an H level to an L level, internal nodes INA1–INA5 attain an H level substantially at the same timing and p channel MOS transistors P1–P5 are rendered non-conductive substantially at the same timing, as described above with reference to FIGS. 1A and 1B. The potentials of internal nodes INB1–INB5 sequentially rise to an H level as described above with reference to FIGS. 2A and 2B. As a result, the time period during which both p channel MOS transistors and n channel MOS transistors are in a conductive state is shortened sufficiently, thereby suppressing through current which flows from power supply node 1 to ground node 2. At this time, output signal line 5 is also discharged gradually to the ground potential level. Output node 4 is discharged only by MOS transistor N1 at first, and then by the progressively increasing current. Since MOS transistors N2–N5 are rendered conductive in sequence, output signal DOUT is discharged moderately at first and then rapidly. Since output signal DOUT is discharged at a high speed after the voltage level of output node 4 has fallen to a level at which a ringing is not generated, output signal DOUT has no undershoot.

When input signal IN rises from an L level to an H level, internal nodes INB1–INB5 fall from an H level to an L level substantially at the same timing, and MOS transistors N1–N5 are rendered non-conductive substantially at the same timing, as described above with reference to FIGS. 2A and 2B. In the meantime, p channel MOS transistors P1–P5 are rendered conductive in sequence because internal nodes INA1–INA5 fall from an H level to an L level in sequence, as described with reference to FIGS. 1A and 1B. The voltage level of output signal DOUT rises moderately at first and then rapidly. Output node 4 is charged at a high speed when it attains sufficiently high voltage level, whereby generation of an overshoot can be surely suppressed.

By applying the structure of the present invention to both of a charging circuit and a discharging circuit of output signal line 5 and output node 4, it is possible to provide a stable output signal DOUT with no overshoot or undershoot.

As described above, in accordance with the first embodiment of the present invention, an MOS transistor is added which receives at its gate a complementary signal to that applied to gates of output driving MOS transistors, so as to drive their control electrodes. As a result, a stable output signal can be obtained with a less consumed current even though these output driving MOS transistors are rendered non-conductive not at the same time and are rendered conductive in sequence.

Bipolar transistors can be utilized in place of MOS transistors P1–P5 and N1–N5 in this first embodiment. When bipolar transistors are employed, the PNP bipolar transistors are replaced for p channel MOS transistors and NPN bipolar transistors are replaced for n channel MOS transistors.

[Embodiment 2]

Figure 4A:
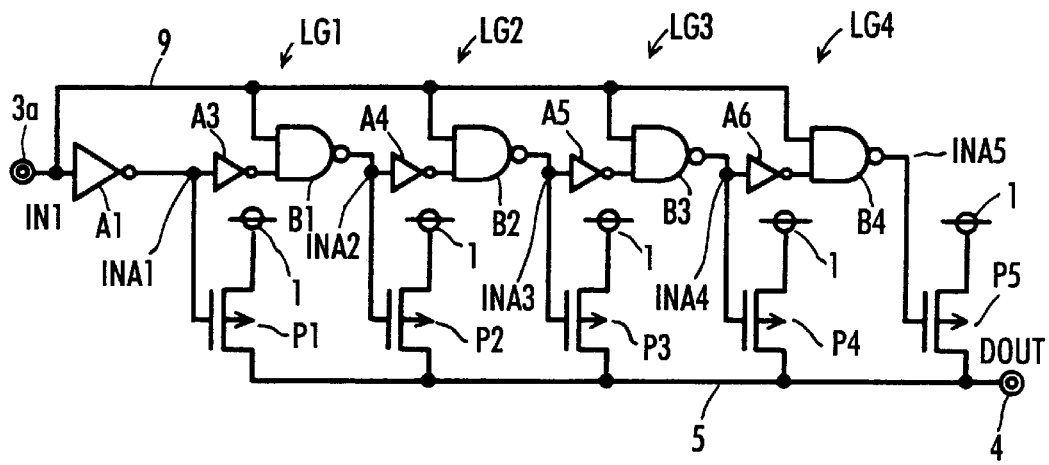
FIGS. 4A and 4B show a structure and operation waveforms of a semiconductor circuit in accordance with a second embodiment of the present invention, respectively.

FIG. 4A shows a main portion of a structure of a semiconductor circuit in accordance with a second embodiment of the present invention. FIG. 4A shows an arrangement as an example in which output signal line 5 and output node 4 are driven by five p channel MOS transistors P1–P5.

In FIG. 4A, 2 input, 1 output logic gates LG1–LG4 are connected between respective gate electrodes of p channel MOS transistors P1–P5 connected in parallel and each connected between power supply node 1 and output signal line 5. 2 input, 1 output logic gates LG1–LG4 are cascade-connected. MOS transistors P1–P5 have their gate electrodes connected to internal nodes INA1–INA5. Internal node INA1 receives input signal IN1 applied to input node 3a through inverter A1. Logic gate LG1 includes an inverter A3 for inverting the potential of the signal of internal node INA1 and a two-input NAND gate B1 for receiving an output signal of inverter A3 and input signal IN1 through a signal line 9. An output signal of NAND gate B1 is applied to internal node INA2.

Figure 4B:
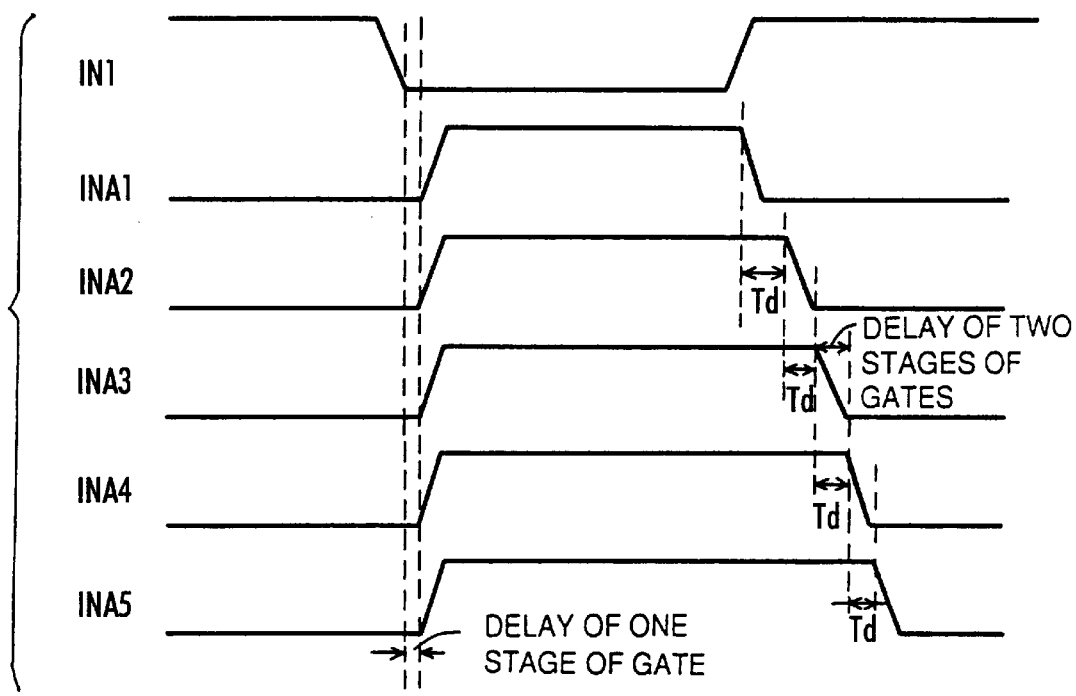

Logic gate LG2 includes an inverter A4 for inverting the signal of internal node INA2 and a two-input NAND gate B2 for receiving an output signal of inverter A4 and the signal on signal line 9. An output signal of NAND gate B2 is applied to input node INA3. Logic gate LG3 includes an inverter A5 for inverting the signal of internal node INA3 and a two-input NAND gate B3 for receiving an output signal of inverter A5 and the signal on signal line 9. An output signal of NAND gate B3 is supplied to input node INA4. Logic gate LG4 includes an inverter A6 for inverting the signal of internal node INA4 and a two-input NAND gate B4 for receiving an output signal of inverter A6 and the signal on signal line 9. A gate delay provided by inverter A1 is set substantially equal to each gate delay of NAND gates B1–B4. Operation of this circuit will be described below with reference to FIG. 4B which shows operation waveforms thereof.

When input signal IN1 is at an H level, NAND gates B1–B4 function as inverter buffers. More specifically, logic gates LG1–LG4 each operate as a circuit formed by two stages of inverters, and internal nodes INA1–INA5 are at an L level. In this state, output signal line 5 is charged to power supply potential Vcc level.

When input signal IN1 falls from an H level to an L level, inverter A1 drives the potential of the signal of node INA1 to an H level. The rise in the potential level of internal node INA1 is delayed for a prescribed time period with respect to the rise of input signal IN1 due to gate delay time provided by inverter A1. At logic gates LG1–LG4, a signal falling from an H level to an L level is transmitted to one input of NAND gates B1–B4 through signal line 9. NAND gates B1–B4 respectively provides a signal of an H level at their outputs. As mentioned previously, the gate delay provided by inverter A1 is the same as that provided by NAND gates B1–B4. Therefore, internal nodes INA1–INA5 rise to an H level all at the same timing (time), and MOS transistors P1–P5 are all rendered non-conductive substantially at the same timing.

When input signal IN1 rises from an L level to an H level, the potential of internal node INA1 falls from an H level to an L level. This change in potential of internal node INA1 occurs after the gate delay time provided by inverter A1 has lapsed from the change in potential of input signal IN1.

When the potential of signal line 9 attains an H level, NAND gates B1–B4 function as inverter buffers, and each logic gate LG1–LG4 operates as a buffer circuit formed by two stages of inverters. Internal nodes INA2, INA3, INA4 and INA5 sequentially fall from an H level to an L level with two stage worthy amount of gate delay time provided by each logic gate LG1–LG4. In response to the fall in the potential of internal nodes INA1–INA5, MOS transistors P1–P5 are sequentially rendered conductive, gradually charging output signal line 5 and output node 4 to the level of power supply voltage Vcc. Therefore, upon charging of output signal line 5, change in current does not occur abruptly but moderately with a small value of di/dt, so that generation of a ringing (an overshoot) at an output node can be sufficiently suppressed. Furthermore, MOS transistors P1–P5 are rendered non-conductive substantially at the same timing, so that consumed current (through current) can be surely reduced.

[Modification 1]

Figure 5A:
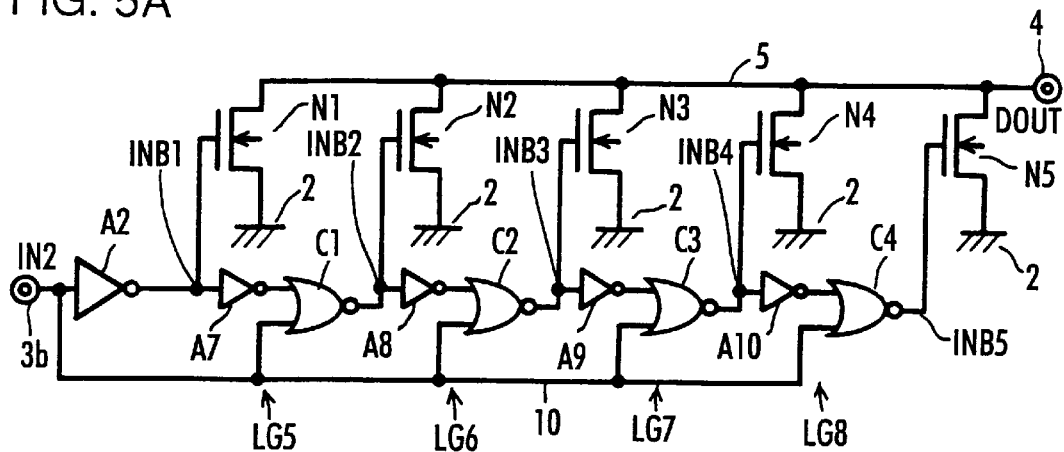
FIGS. 5A and 5B show a structure and operation waveforms of a first modification of the second embodiment of the present invention, respectively.

FIG. 5A shows a structure of a first modification of the second embodiment. FIG. 5A shows a circuit in which five n channel MOS transistors N1–N5 discharge output signal line 5 to the ground potential level.

In FIG. 5A, the semiconductor circuit includes cascade-connected logic gates LG5–LG8, each of which is connected between respective gate electrodes of n channel MOS transistors N1–N5, and inverter A2 for inverting input signal IN2 applied to input node 3b and transmitting the inverted signal to input node INB1. MOS transistors N1–N5 have their gate electrodes connected to internal nodes INB1–INB5, respectively.

Logic gate LG5 includes an inverter A7 for inverting the signal of internal node INB1 and a two-input NOR gate C1 for receiving an output signal of inverter A7 and a signal supplied from internal node 3b to a signal line 10. An output signal of NOR gate C1 is applied to internal node INB2. Logic gate LG6 includes an inverter A8 for inverting the signal at internal node INB2 and a two-input NOR gate C2 for receiving an output signal of inverter A8 and the signal on signal line 10. An output signal of NOR gate C2 is applied to internal node INB3.

Figure 5B:
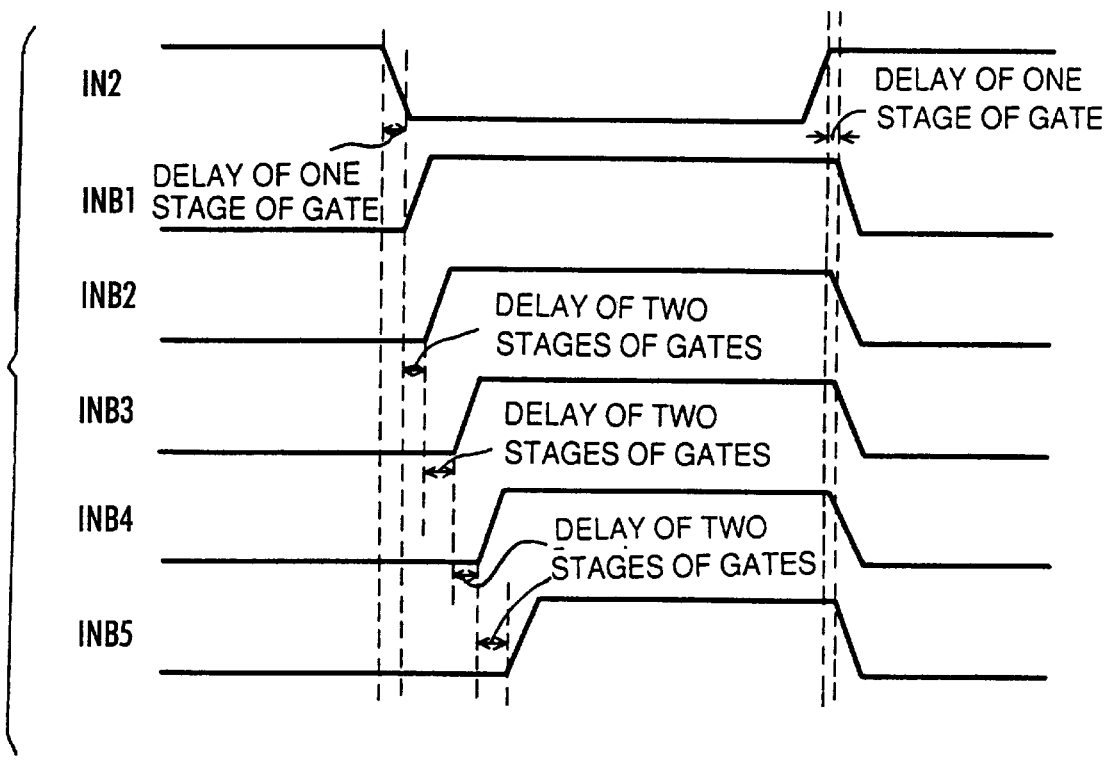

Logic gate LG7 includes an inverter A9 for inverting the signal of internal node INB3 and an NOR gate C3 for receiving an output signal of inverter A9 and the signal of signal line 10. An output signal of NOR gate C3 is applied to internal node INB4. Logic gate LG8 includes an inverter A10 for inverting the signal of internal node INB4 and an NOR gate C4 for receiving an output signal of inverter A10 and the signal on signal line 10. An output signal of NOR gate C4 is applied to internal node INB5. Inverter A2 and NOR gates C1–C4 provide the same gate delay. Operation of the circuit shown in FIG. 5A will be described below with reference to FIG. 5B showing operation waveforms thereof.

When input signal IN2 is at an H level, the signal of signal line 10 is at an H level and NOR gates C1–C4 output an L level signal. In this state, all internal nodes INB1–INB5 are at an L level, and all MOS transistors N1–N5 are in a non-conductive state.

When input signal IN2 falls from an H level to an L level, the potential of internal node INB1 rises from an L level to an H level after the gate delay time provided by inverter A2 has lapsed. Signal line 10 has a low resistance value, and the change in input signal IN2 is applied to each one input of NOR gates C1–C4 at a high speed. Therefore, in this state, all NOR gates C1–C4 function as inverter buffers, and logic gates LG5–LG8 each operate as a delay circuit formed by two stages of inverters.

When the potential of the signal of internal node INB1 has to an H level, the potential of internal node INB2 rises from an L level to an H level after a two stage worthy amount of gate delay time provided by logic gate LG5 has lapsed, thereby turning on MOS transistor N2. Thereafter, the potentials of internal nodes INB3–INB5 sequentially rise from an L level to an H level after two stage worthy amount of gate delay time provided by each respective logic gates LG6–LG8 has passed. Consequently, MOS transistors N3–N5 are sequentially rendered conductive. Since output signal line 5 and output node 4 are driven by the discharging current which progressively increases, the current change ratio is small and generation of a ringing (an undershoot) at output node 4 can be suppressed.

When input signal IN2 rises from an L level to an H level, this change in input signal IN2 is transmitted to NOR gates C1–C4 through signal line 10. As a result, NOR gates C1–C4 function as inverter buffers. Inverter A2 and NOR gates C1–C4 provide substantially the same gate delay. Therefore, after one stage worthy amount of gate delay time has passed from the change in input signal IN2, all internal nodes INB1–INB5 fall from an H level to an L level at the same timing. Consequently, all MOS transistors N1–N5 are rendered non-conductive at the same timing, so that generation of through current can be completely suppressed and consumed current can be reduced.

[Modification 2]

Figure 6A:
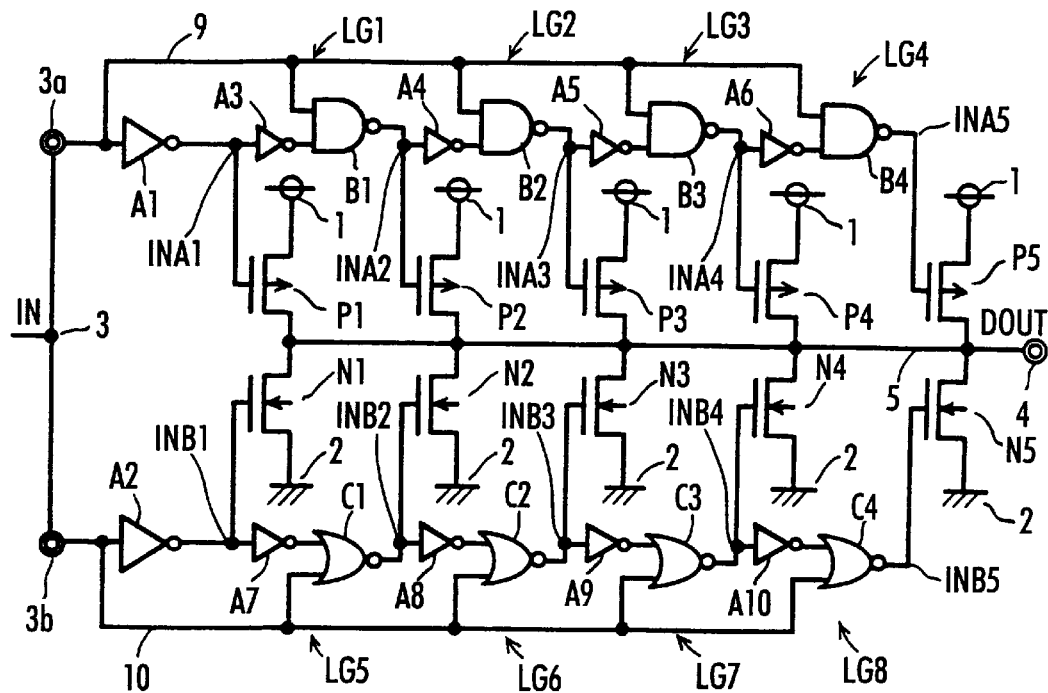
FIGS. 6A and 6B show s structure and operation waveform of a second modification of the second embodiment of the present invention, respectively.
Figure 6B:
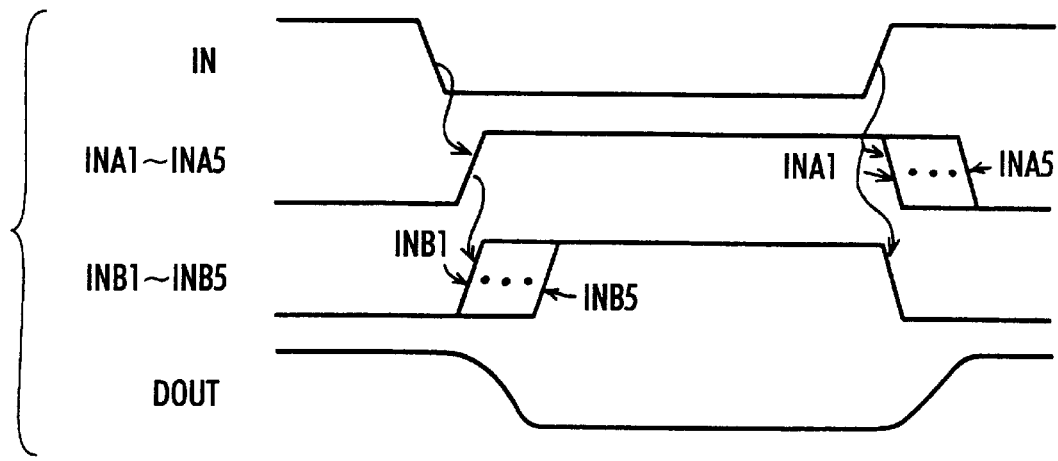

FIG. 6A shows a second modification of the second embodiment in accordance with the present invention. A circuit shown in FIG. 6A is equivalent to a combination of the semiconductor circuits shown in FIGS. 4A and 5A. More specifically, the semiconductor circuit shown in FIG. 6A includes p channel MOS transistors P1–P5 connected in parallel, each of which is connected between output signal line 5 and power supply node 1; cascade-connected logic gates LG1–LG4, each of which is connected between respective gate electrodes of MOS transistors P1–P5; inverter A1 for inverting input signal IN of input node 3 (3a) and transmitting the inverted signal to internal node INA1; n channel MOS transistors N1–N5 connected in parallel, each of which is connected between ground node 2 and output signal line 5; cascade-connected logic gates LG5–LG8, each of which is connected between respective gate electrodes of MOS transistors N1–N5; and inverter A2 for inverting input signal IN applied to input node 3 and transmitting the inverted signal to internal node INB1. In FIG. 6A, like portions are indicated by like reference numerals in FIGS. 4A and 5A. Input signal IN is applied through signal line 9 to each one input of NAND gates B1–B4 included in logic gates LG1–LG4. Similarly, an input signal IN is applied through signal line 10 to each one input of NOR gates C1–C4 included in logic gates LG5–LG8. Operation of the semiconductor circuit shown in FIG. 6A will be described below with reference to FIG. 6B showing operation waveforms thereof.

When input signal IN is at an H level, all internal nodes INA1–INA5 and INB1–INB5 are at an L level, and output signal line 5 is charged through MOS transistors P1–P5 and is thus at an H level. When input signal IN falls from an H level to an L level, this change in signal is transmitted to each one input of NAND gates B1–B4 included in logic gates LG1–LG4. As a result, internal nodes INA1–INA5 rise from an L level to an H level at the same timing (with one stage worthy amount of gate delay time), and all MOS transistors P1–P5 are rendered non-conductive at the same timing.

NOR gates C1–C4 receive the L level signal through signal line 10 and function as inverters. Consequently, logic gates LG operate as delay elements each of which is formed by two stages of inverters. The potentials of input nodes INB1–INB5 sequentially rise with two stage worthy amount of gate delay time after the rise in the potential of input node INB1. In other words, MOS transistors N1–N5 are sequentially rendered conductive and discharge output signal line 5 to the ground potential level. Output signal DOUT is discharged by the progressively increasing current. At this time, the current change ratio is so small that output signal DOUT has no undershoot. MOS transistors P1–P5 are all in non-conductive state when MOS transistors N1–N5 are turned on, so that through current is not generated.

When input signal IN rises from an L level to an H level, the H level signal is applied through signal line 10 to each one input of NOR gates C1–C4 included in logic gates LG5–LG8. Output signals of NOR gates C1–C4 correspondingly fall to an L level. Consequently, the potentials of internal nodes INB1–INB5 fall from an H level to an L level with one stage worthy amount of gate delay time with respect to input signal IN applied to input node 3, thereby turning off all MOS transistors N1–N5 at the same timing.

At logic gates LG1–LG4, the H level signal is applied through signal line 9 to NAND gates B1–B4, which function as inverter buffers. More specifically, logic gates LG1–LG4 each operate as a delay element formed by two stages of inverters and sequentially transmit the signal applied to input node INA1 with two stage worthy amount of the gate delay time. MOS transistors P1–P5 are sequentially rendered conductive, supplying current to output signal line 5. The current change ratio of output signal line 5 is so small that output signal DOUT has no overshoot and a stable output signal DOUT can be obtained. When MOS transistors P1–P5 are rendered conductive sequentially, all MOS transistors N1–N5 are in a non-conductive state, whereby there is little possibility of generating through current and consumed current can be reduced.

Bipolar transistors can be also utilized in place of MOS transistors in the second embodiment shown in FIGS. 4A–6B.

[Embodiment 3]

Figure 7A:
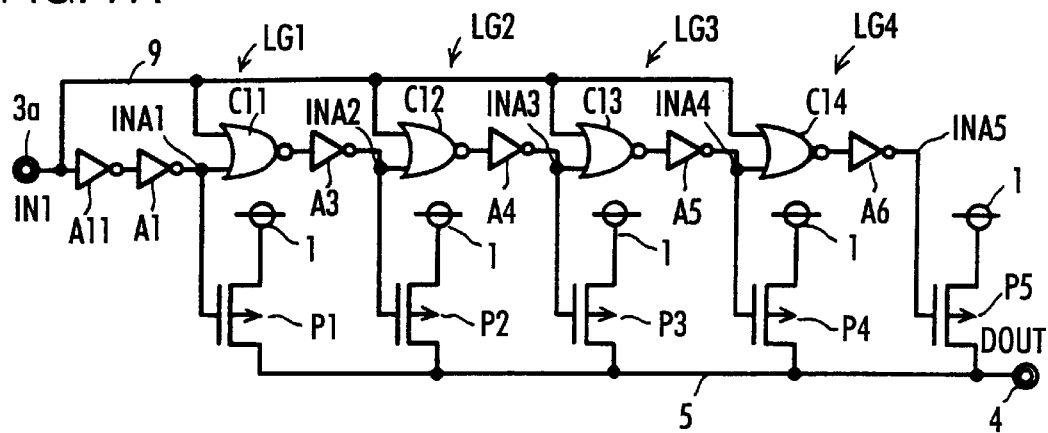
FIGS. 7A and 7B show a structure and operation waveforms of a semiconductor circuit in accordance with a third embodiment of the present invention, respectively.
Figure 7B:
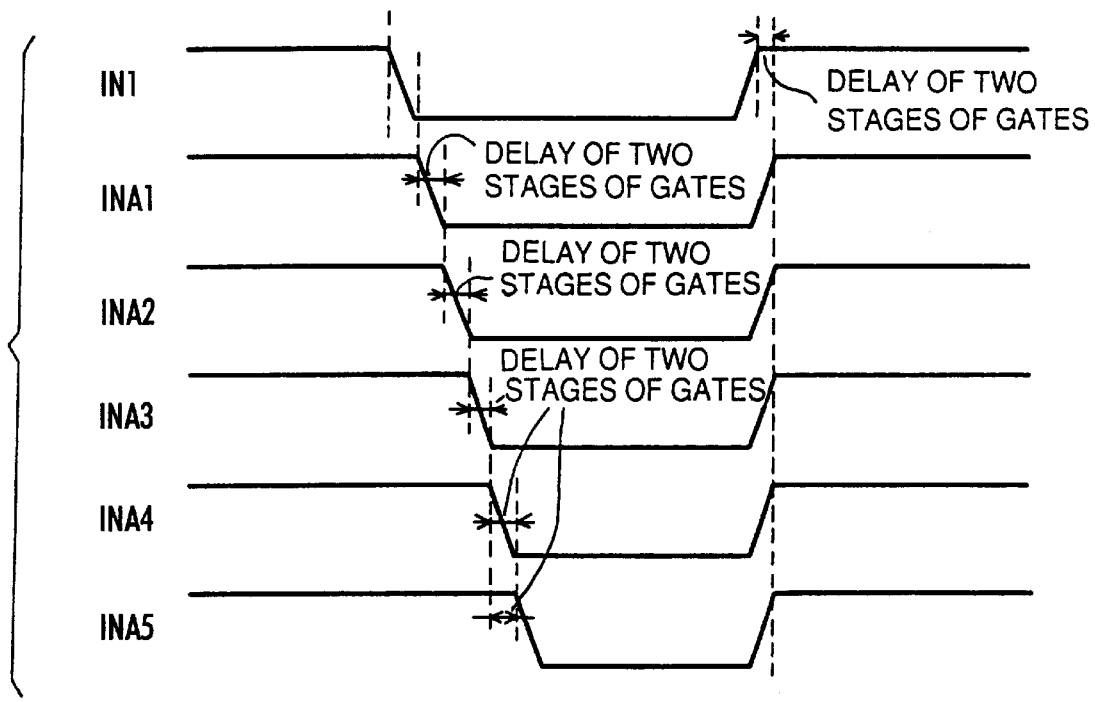

FIGS. 7A and 7B show a structure and operation of a semiconductor circuit in accordance with a third embodiment of the present invention. In FIG. 7A, the semiconductor circuit includes five p channel MOS transistors P1–P5 connected in parallel each of which is connected between power supply node 1 and output signal line 5. MOS transistors P1–P5 have their gate electrodes connected to internal nodes INA1–INA5, respectively.

Logic gates LG1–LG4 are provided between respective gate electrodes of MOS transistors P1–P5, that is, between respective internal nodes INA1–INA5. Internal node INA1 receives input signal IN1 applied to internal input node 3a through two stages of inverters A11 and A1.

Logic gate LG1 includes a two-input NOR gate C11 for receiving the signal on internal node INA1 and a signal on signal line 9, and an inverter A3 for receiving an output signal of NOR gate C11. An output signal of inverter A3 is transmitted to internal node INA2. Logic gate L2 includes a two-input NOR gate C12 for receiving the signal on internal node INA2 and the signal on signal line 9, and an inverter A4 for receiving an output signal of NOR gate C12. An output signal of inverter A4 is applied to internal node INA3.

Logic gate LG3 includes a two-input NOR gate C13 for receiving the signal on internal node INA3 and the signal on signal line 9, and an inverter A5 for receiving an output signal of NOR gate C13. An output signal of inverter A5 is transmitted to internal node INA4. Logic gate LG4 includes a two-input NOR gate C14 for receiving the signal on internal node INA4 and the signal on signal line 9, and an inverter A6 for receiving an output signal of NOR gate C14. An output signal of inverter A6 is transmitted to internal node INA5.

When the delay time provided by NOR gates C11–C14 is equal to that provided by inverter A11 and the delay time provided by inverters A3–A6 is equal to that provided by inverter A1, logic gates LG1–LG4 provide two stage worthy amount of gate delay time equal to that provided by a delay element formed of inverters A11 and A1. Referring to FIG. 7B showing operation waveforms, operation of the semiconductor circuit shown in FIG. 7A will be described.

When input signal IN1 is at an H level, the delay element formed by inverters A11 and A1 outputs an H level signal to internal node INA1. The signal on signal line 9 is also at an H level. When the signal on signal line 9 is at an H level, all output signals of NOR gates C11–C14 attain an L level and output signals of inverters A3–A6 simultaneously attain an H level. In other words, internal nodes INA1–INA5 are all at an H level, MOS transistors P1–P5 are all in a non-conductive state.

When input signal IN1 falls from an H level to an L level, the potential of internal node INA1 falls from an H level to an L level with a slight delay corresponding to the two stage worthy amount of gate delay time provided by inverters A11 and A1. The signal on signal line 9 falls from an H level to an L level at the substantially same timing as input signal IN1 applied to input node 3a. NOR gates C11–C14 function as inverters, and logic gates LG1–LG4 function as delay circuits formed by two stages of inverters. As a result, the signal applied to internal node INA1 is delayed for a prescribed time period (two stage worthy amount of gate delay time) by logic gates LG1–LG4 before transmitted to internal nodes INA2–INA5 in sequence. MOS transistors P1–P5 are sequentially rendered conductive, charging output signal line 5 and output node 4 to the power supply voltage Vcc level. Since the current change ratio di/dt of output signal line 5 is small, generation of an overshoot of output signal line DOUT which is output from output node 4 can be suppressed.

When input signal IN1 rises from an L level to an H level, the signal on signal line 9 similarly rises from an L level to an H level. NOR gates C11–C14 included in logic gates LG1–LG4 all output an L level signal. Input signal IN1 is transmitted through two stages of inverters A11 and A1 to internal node INA1. That is, when input signal IN1 applied to input node 3a rises from an L level an H level, all internal nodes INA1–INA5 rise from an L level to an H level at the same timing (with the gate delay time worthy of that provided by two stages of inverters) and MOS transistors P1–P5 are rendered non-conductive all at the same timing. Since MOS transistors P1–P5 are rendered non-conductive at the same timing, consumed current (through current) can be suppressed.

[Modification 1]

Figure 8A:
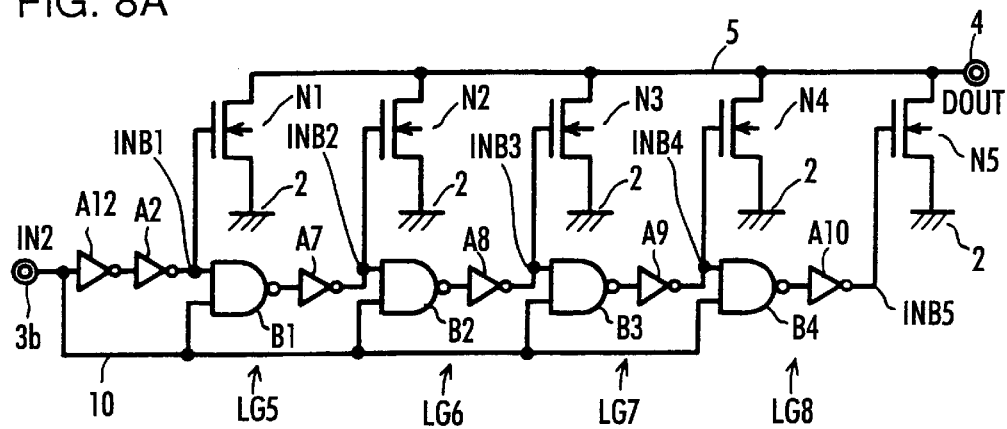
FIGS. 8A and 8B show a structure and operation waveforms of a first modification of the third embodiment of the present invention, respectively.
Figure 8B:
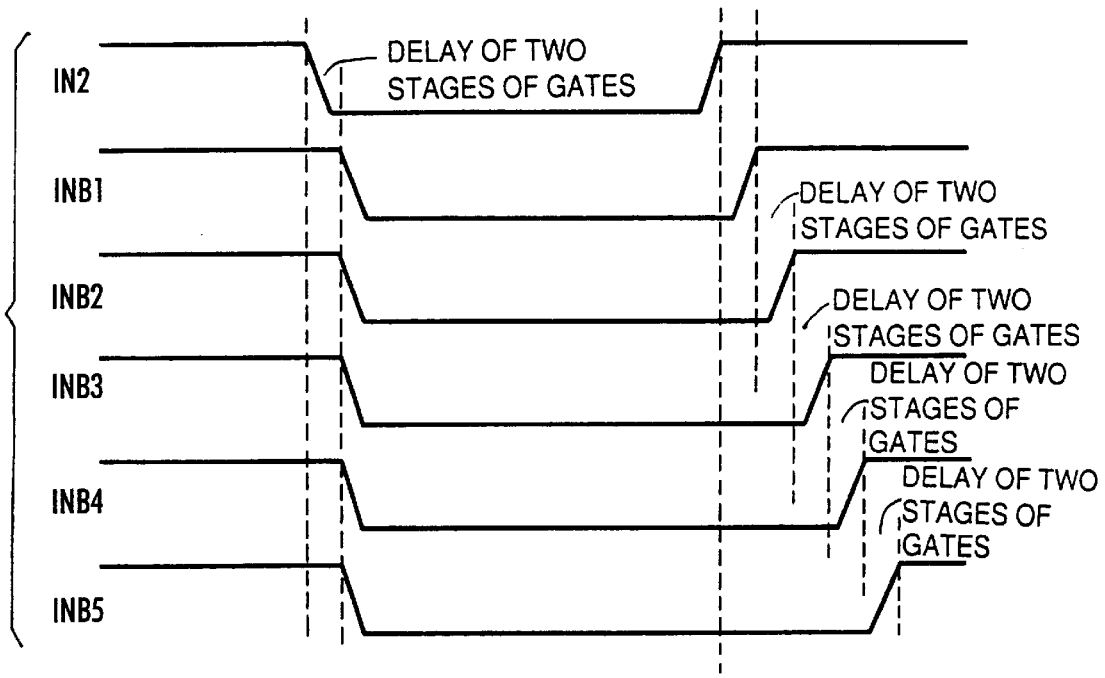

FIGS. 8A and 8B show a structure and operation of a first modification of the third embodiment in accordance with the present invention. In FIG. 8A, five n channel MOS transistors N1–N5 are connected in parallel to each other between output signal line 5 and ground node 2 so as to drive output signal line 5 and output node 4. MOS transistors N1–N5 have their gate electrodes connected to internal nodes INB1–INB5, respectively.

Input signal IN2 applied to input node 3b is transmitted through two stages of inverters A12 and A2 to internal node INB1. Logic gates LG5–LG8 are cascade-connected between internal nodes INB1–INB5. Logic gate LG5 includes a two-input NAND gate B1 for receiving the signal of internal node INB1 and a signal on signal line 10, and an inverter A7 for receiving an output signal of NAND gate B1. An output signal of inverter A7 is applied to internal node INB2. Logic gate LG6 includes an NAND gate B2 for receiving the signal of internal node INB2 and the signal on signal line 10, and an inverter A8 for receiving an output signal of NAND gate B2. An output signal of inverter A8 is applied to internal node INB3. Logic gate LG7 includes an NAND gate B3 for receiving the signal of internal node INB3 and the signal on signal line 10, and an inverter A9 for receiving an output signal of NAND gate B3. An output signal of inverter A9 is applied to internal node INB4.

Logic gate LG3 includes an NAND gate B4 for receiving the signal of internal node INB4 and the signal on signal line 10, and an inverter A10 for receiving an output signal of NAND gate B4. An output signal of inverter A10 is applied to internal node INB5. Each delay time provided by NAND gates B1–B4 is set equal to that provided by inverters A12 or A2. Inverter A2 and inverters A7–A10 each have the same delay time. As a result, when an H level signal is applied to signal line 10, the delay time provided by a delay element formed by inverters A12 and A2 is equal to that provided by logic gates LG5–LG8 (two stage worthy amount of gate delay time). Description will now be made with reference to FIG. 8B showing operation waveforms of the semiconductor circuit shown in FIG. 8A.

When input signal IN2 is at an H level, all internal nodes INB1–INB5 are at an H level, and MOS transistors N1–N5 are in a conductive state. When input signal IN2 falls from an H level to an L level, the signal on signal line 10 accordingly falls from an H level to an L level. Consequently, output signals of NAND gates B1–B4 within logic gates LG5–LG8 rise to an H level, and correspondingly output signals of inverters A7–A10 fall to an L level. Input signal IN2 is transmitted through two stages of inverters A12 and A2 to internal node INB1. Logic gates LG5–LG8 lower the potentials of corresponding internal nodes INB2–INB5 from an H level to an L level in response to the signal on signal line 10 with a delay of two stages of gates (an NAND gate and an inverter). In other words, internal nodes INB2–INB5 attain an L level at the same time, thereby turning off MOS transistors N1–N5.

When input signal IN2 rises from an L level to an H level, the potential of internal node INB1 rises from an L level to an H level after the delay time provided by inverters A12 and A2 has lapsed. The signal on signal line 10 attains an H level in response to input signal IN2, and NAND gates B1–B4 operate as inverters. In this state, logic gates LG5–LG8 are therefore equivalent to delay elements formed by two stages of inverters. The signal applied to internal node INB1 is sequentially transmitted to internal nodes INB2–INB5 with a delay of two stages of gates, thereby turning on MOS transistors N1–N5 in sequence. Since the ratio of change in discharging current of output signal line 5 is made small, generation of an undershoot of output signal DOUT at output node 4 can be suppressed.

Since MOS transistors N1–N5 are rendered non-conductive at the same timing, consumed current (through current) can be reduced.

[Modification 2]

Figure 9A:
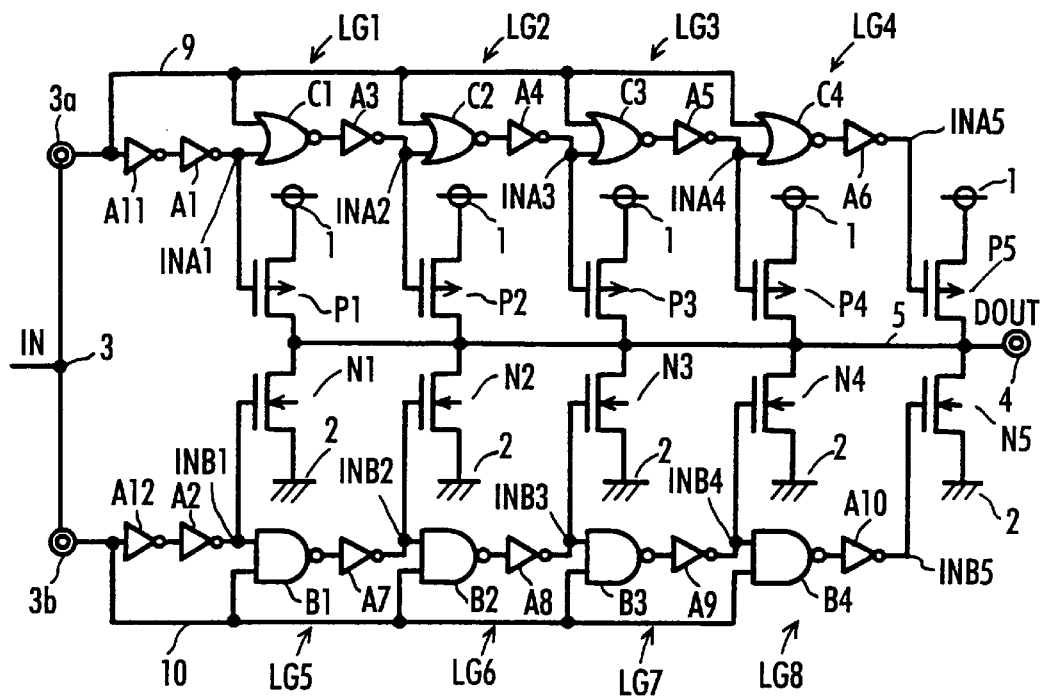
FIGS. 9A and 9B show a structure and operation waveforms of a second modification of the third embodiment of the present invention, respectively.
Figure 9B:
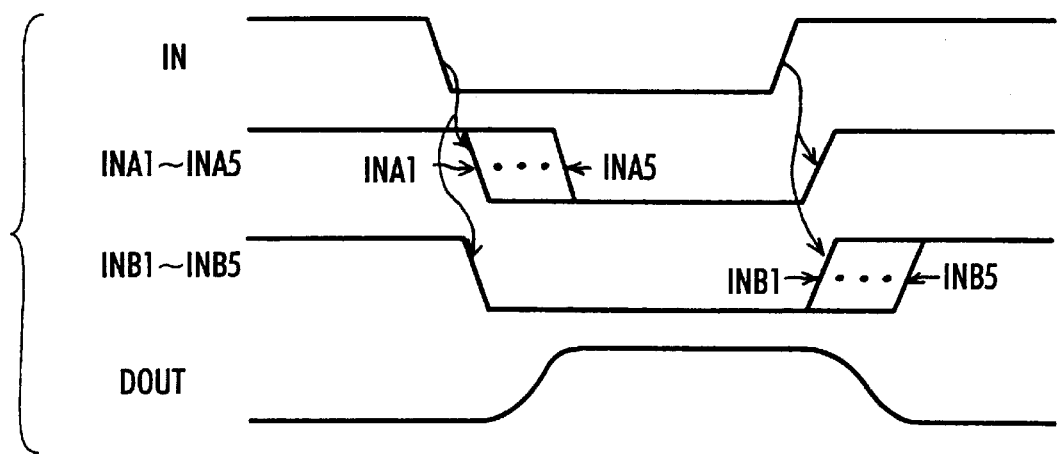

FIGS. 9A and 9B show a structure and operation of a second modification of the third embodiment in accordance with the present invention. In FIG. 9A, a semiconductor circuit includes p channel MOS transistors P1–P5 connected in parallel, each connected between output signal line 5 and power supply node 1; n channel MOS transistors N1–N5 connected in parallel, each of which is connected between ground node 2 and output signal line 5; cascade-connected logic gates LG1–LG4, each of which is connected between respective gate electrodes of MOS transistors P1–P5; cascade-connected logic gates LG5–LG8 connected between respective gate electrodes of MOS transistors N1–N5; two stages of inverters A11 and A1 for transmitting input signal IN applied to input node 3 to internal node INA1; and inverters A12 and A2 in two stages for transmitting the input signal applied to input node 3 to input node INB1. Logic gates LG1–LG4 receive input signal IN through signal line 9, logic gates LG5–LG8 receive input signal IN through signal line 10. The structure of the semiconductor circuit shown in FIG. 9A is equivalent to a combination of the circuits shown in FIGS. 7A and 8A, and therefore the corresponding portions are labeled with the same reference numerals as those in FIGS. 7A and 8A.

Logic gates LG1–LG4 include two-input NOR gates C1–C4, each receiving the signal on signal line 9 at one input and a signal of the gate electrode (internal node) of the corresponding MOS transistor at the other input, and inverters (A3–A6) each receiving an output signal of the corresponding NOR gate and applying the signal to the gate electrode (subsequent stage node) of the transistor in the subsequent stage, respectively. Logic gates LG5–LG8 include NAND gates (B1–B4) for receiving the signal on signal line 10 and a signal of the gate electrode (internal node) of the transistor in the previous stage, and inverters (A7–A10) for inverting an output signal of the corresponding NAND gate and applying the inverted signal to the gate electrode (internal node) of the transistor in the subsequent stage. Operation of the semiconductor circuit shown in FIG. 9A will be described below with reference to FIG. 9B showing operation waveforms thereof.

When input signal IN is at an H level, internal nodes INA1–INA5 and INB1–INB5 are at an H level, MOS transistors P1–P5 are in a non-conductive state, MOS transistors N1–N5 are in a conductive state, and output signal DOUT is at a low level of the ground potential. When input signal IN falls from an H level to an L level, internal nodes INB1–INB5 fall to an L level at the same timing with a delay of two stages of gates, and MOS transistors N1–N5 are all rendered non-conductive at the same timing. Internal nodes INA1–INA5 sequentially falls to an L level with a delay time provided by logic gates LG1–LG4, thereby turning on MOS transistors P1–P5 in sequence. Here, MOS transistors N1–N5 have been already turned off when MOS transistors P1–P5 are rendered conductive, and therefore there is no through current flowing from power supply node 1 to ground node 2. Output signal line 5, that is output signal DOUT, is driven to the power supply voltage Vcc level by MOS transistors P1–P5. Since MOS transistors P1–P5 are sequentially rendered conductive, the current change ratio at output signal line 5 is small and output signal DOUT has no overshoot.

When input signal IN rises from an L level to an H level, logic gates LG1–LG4 respond to the signal on output line 9 to raise each potential of internal nodes INA2–INA5 to an H level with a delay of two stages of gates. Inverters A11 and A1 drive the potential of internal node INA1 from an L level to an H level. In other words, the potentials of internal nodes INA1–INA5 all rise from an L level to an H level at the same timing, thereby turning off MOS transistors P1–P5 at the same timing. Meanwhile, logic gates LG5–LG8 function as delay circuits because NAND gates B1–B4 operate as inverters due to the signal on signal line 10. As a result, the potentials of internal nodes INB1–INB5 sequentially rise from an L level to an H level, thereby turning on MOS transistors N1–N5 in sequence. Output signal line 5 is discharged by MOS transistors N1–N5. At this time, the current change ratio is small and output signal DOUT has no undershoot.

Since MOS transistors P1–P5 have been already turned off at the same timing when MOS transistors N1–N5 are rendered conductive, no through current from power supply node 1 to ground node 2 is generated.

As described above, upon charging or discharging of output signal line 5, charging current or discharging current is gradually increased and the charging current or discharging current is increased after output node 4 has attained a level at which output signal DOUT has no ringing, so that output signal DOUT is generated without a delay in response nor generation of a ringing. The time period during which p channel MOS transistors P1–P5 and n channel MOS transistors N1–N5 are both in a conductive state is very short, thereby reliably suppressing generation of through current and achieving a circuit with low consumed current.

[Embodiment 4]

Figure 10A:
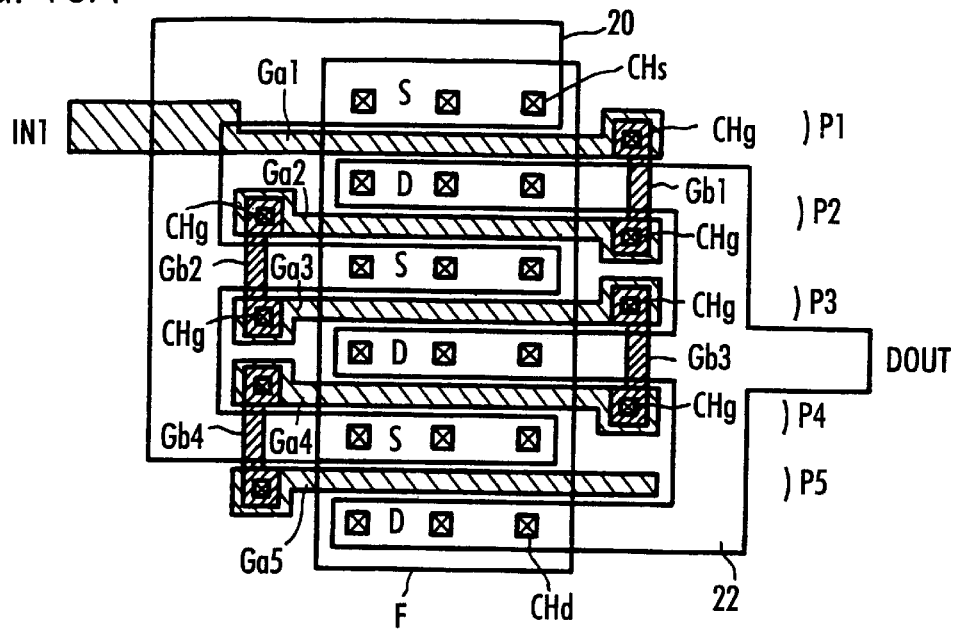
FIGS. 10A–10C show a layout and a structure of interconnections and resistors of the semiconductor circuit in accordance with the third embodiment of the present invention, respectively.
Figure 10B:
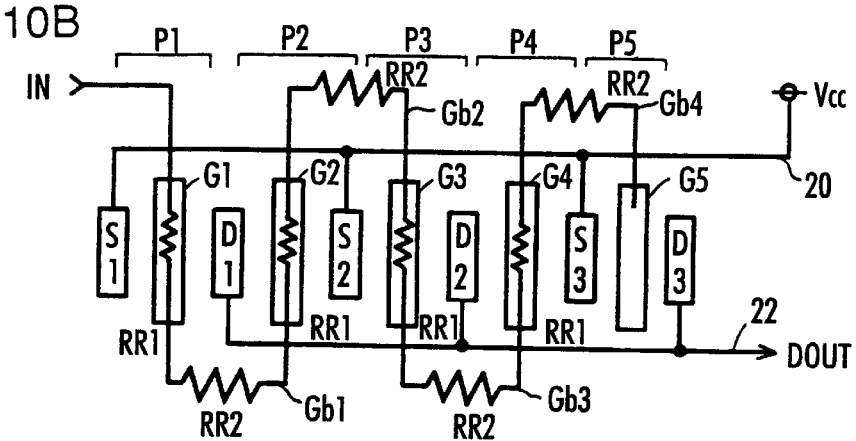
Figure 10C:
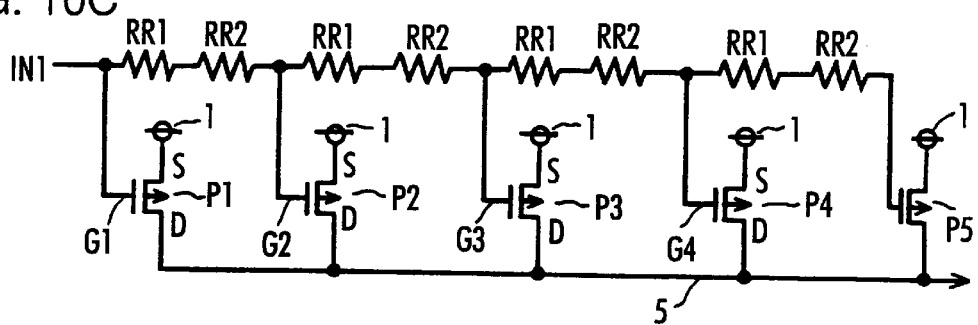

FIGS. 10A–10C show a structure of a fourth embodiment in accordance with the present invention. The structure shown in FIGS. 10A–10C is most effective when employed in combination with the first embodiment shown in FIGS. 1A–3B. FIGS. 10A–10C show the structure of a circuit portion for driving output signal DOUT to the power supply voltage Vcc level. A similar structure can be employed in a circuit portion for driving output signal DOUT to the ground potential GND level. FIG. 10A shows the planar pattern layout, FIGS. 10B schematically shows connections between elements, and FIG. 10C shows an electrically equivalent circuit.

Referring to FIG. 10A, active regions (high impurity concentration regions) are formed to be isolated from one another in a field active region F. In FIG. 10A, high impurity concentration region S for forming a source region and a high impurity concentration region D for forming a drain region are arranged alternately. Gate electrode interconnections Ga1–Ga5 are provided in a region (channel region) between two adjacent impurity regions S and D. Gate electrode interconnections Ga1–Ga5 constitute gate electrodes of MOS transistors P1–P5.

Impurity regions D and S are shared by two adjacent transistors, thereby reducing an area occupied by elements. Gate electrode interconnections Ga1–Ga5 are interconnected by interconnection layers Gb1–Gb4 formed of a material with high resistance such as polysilicon. Interconnection layers Gb1–Gb4 alternately connect adjacent one ends and the other ends of gate electrode interconnections Ga1–Ga5. In other words, interconnection layers Gb1–Gb4 are arranged alternately on one side and the other side opposite to the one side in field active region F. Gate electrode interconnections Ga1–Ga5 are connected to interconnection layers Gb1–Gb4 through a contact hole CHg. Here, the term "layer" is used to indicate a patterned layer, or line.

Low resistance conductive layers 20 and 22 formed of aluminum or the like are formed on gate electrode interconnections Ga1–Ga5 and interconnection layers Gb1–Gb4. Conductive layer 20 is supplied with power supply voltage Vcc and conductive layer 22 transmits output signal DOUT. Conductive layer 20 is formed on conductive layer 22. Conductive layer 20 is connected through a contact hole CHs to impurity layer S forming a source region, and conductive layer 22 is connected through a contact hole CHd to impurity region D forming a drain region. Input signal IN1 is applied to gate electrode interconnection Ga1.

In FIG. 10B, p channel MOS transistor P1 is formed by a source impurity region S1, a gate electrode interconnection G1 and a drain impurity region D1. MOS transistor P2 is formed by drain impurity region D1, a gate electrode interconnection G2 and a source impurity region S2. MOS transistor P3 is formed by source impurity region S2, a gate electrode interconnection G3 and a drain impurity region D2. MOS transistors P4 is formed by drain impurity region D2, a gate electrode interconnection G4 and a source impurity region S3. MOS transistor P5 is formed by source impurity region S3, a gate electrode interconnection G5 and a drain impurity region D3.

Power supply voltage Vcc is applied through conductive layer 20 to source impurity regions S1–S3. Drain impurity regions D1–D3 are connected to conductive layer 22. Gate electrode interconnections G1–G5 each have a resistance RR1. Gate electrode interconnections G1 and G2 are interconnected by interconnection layer Gb1 having a resistance RR2. Gate electrode interconnections G2 and G3 are connected by interconnection layer Gb2 having resistance RR2. Gate electrode interconnections G3 and G4 are connected by interconnection layer Gb3 having resistance RR2, and gate electrode interconnections G4 and G5 are connected by interconnection layer Gb4 having resistance RR2.

Resistance RR1 of gate electrodes G1–G5 and resistance RR2 of interconnection layers Gb1–Gb4 are made different from each other by adjusting the amount of impurity implanted to polysilicon as interconnection material.

In FIG. 10C, MOS transistor P1 receives input signal IN1 at its gate electrode GI. Resistors having resistance RR1 and RR2 are connected in series between gate electrodes G1 and G2 of MOS transistors P1 and P2. Resistors having resistance RR1 and RR2 are connected in series between the gate electrodes of two MOS transistors. The delay time of the signal provided to MOS transistors P2–P5 can be set at a desired value by appropriately adjusting the value of resistance RR2.

At this time, even if resistance of gate electrode interconnection Ga1–Ga5 is made small for the sake of fast operation, problems associated with the reduced resistance of the gate electrode layers can be compensated for without an increase in layout area by providing sufficiently high resistance RR2 to interconnection layers Gb1–Gb4, and MOS transistors P1–P5 can be rendered conductive with a desired delay time. Even when reduced resistance gate electrode interconnections Ga1–Ga5 is not so reduced, if a time difference between turning on of MOS transistors P1–P5 should be made greater so as to suppress a noise (a ringing), a desired delay time can be readily achieved without an increase in occupancy area by implementing an appropriately high resistance RR2 in interconnection layers Gb1–Gb4.

Since MOS transistors P1–P5 are respectively connected by interconnection layers Gb1–Gb4 having a variable resistance, propagation delay time of a signal for each of MOS transistors P2–P5 can be set appropriately and efficiently.

Figure 11:
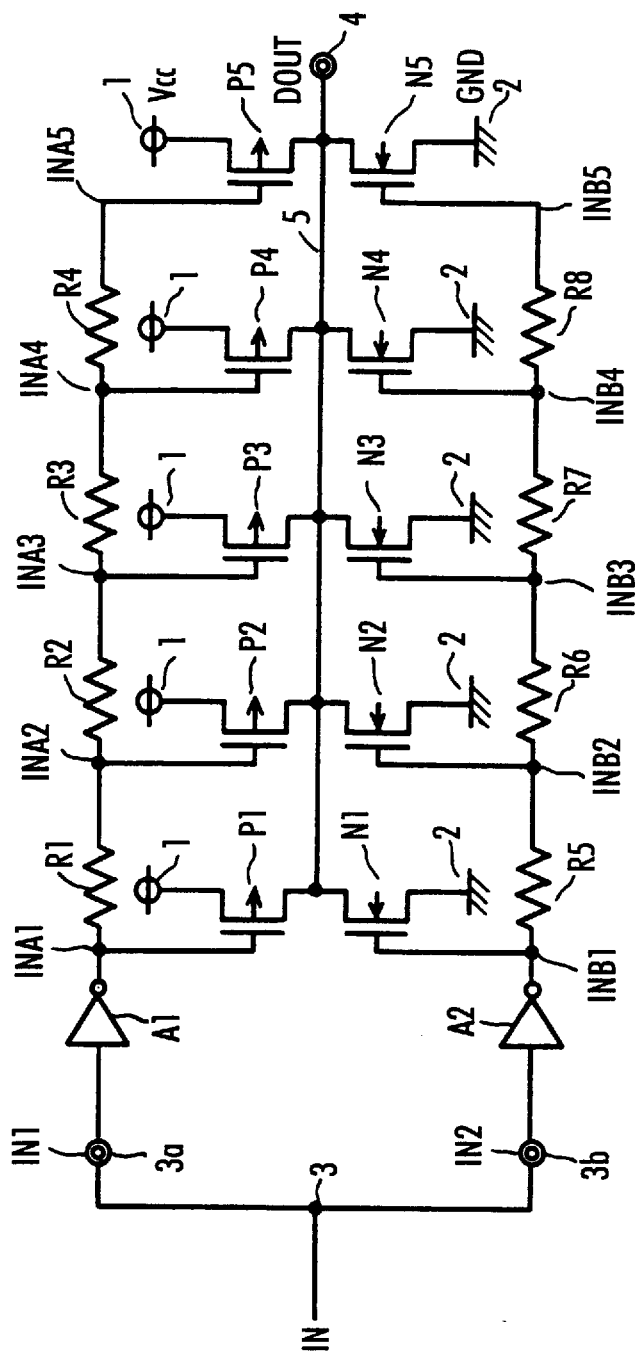
FIG. 11 shows a structure of a conventional output circuit.
Figure 12:
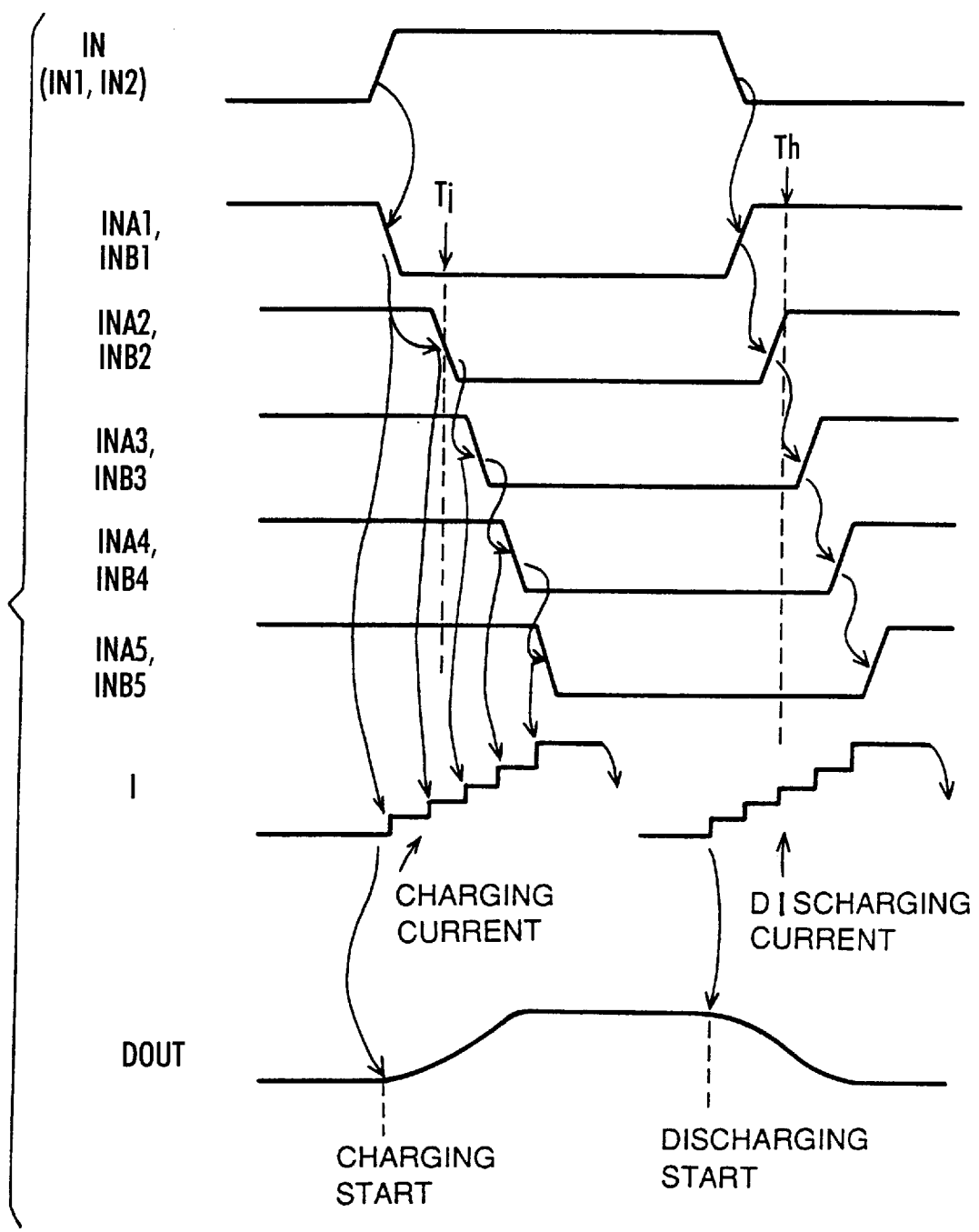
FIG. 12 shows signal waveforms illustrating operation of the output circuit shown in FIG. 11.
Figure 13:
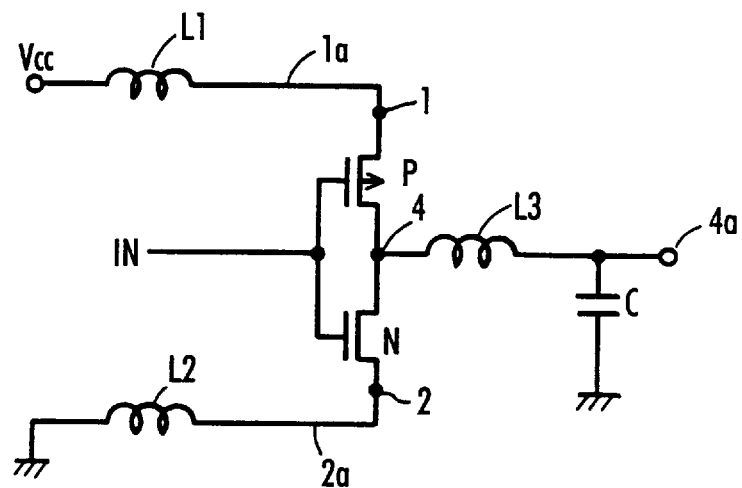
FIG. 13 illustrates a problem of the conventional output circuit.
Figure 14:
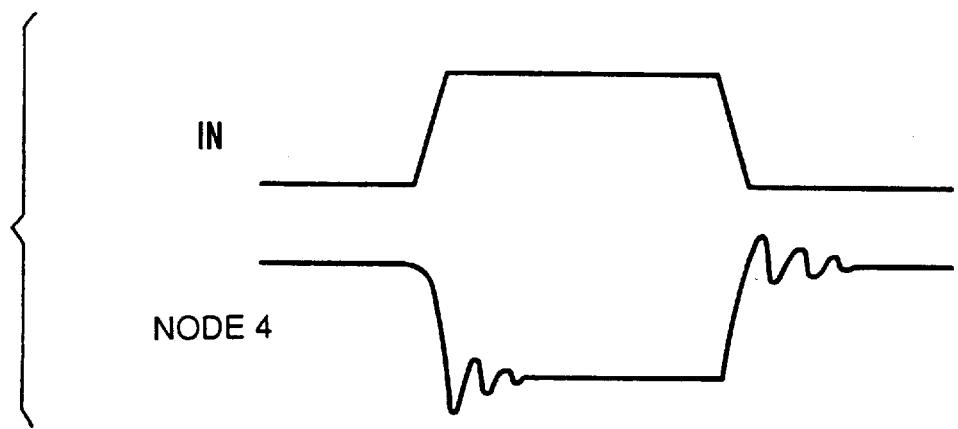
FIG. 14 shows waveforms illustrating operation of the output circuit in FIG. 13.
Figure 15A:
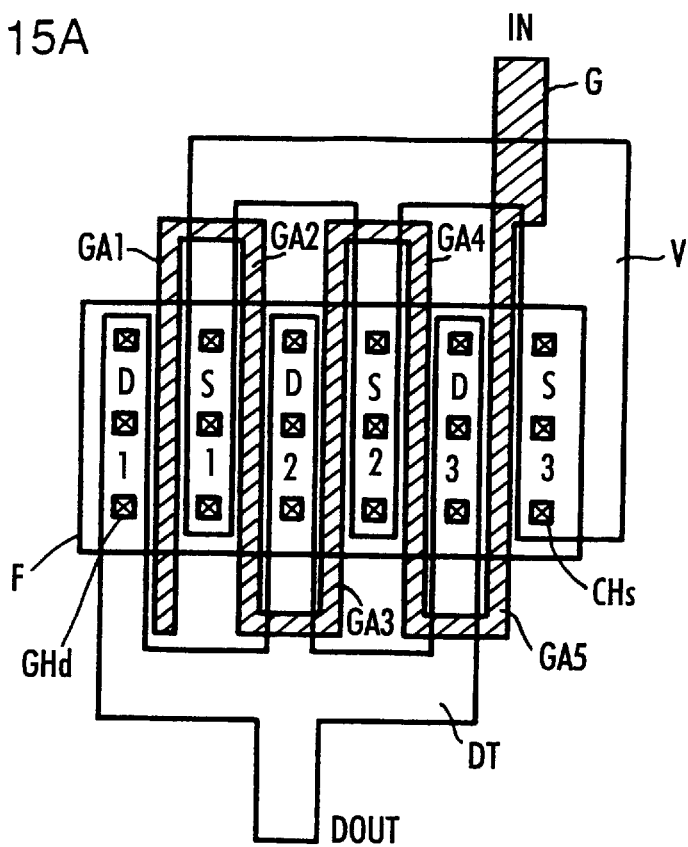
FIGS. 15A and 15B show a layout and a connection manner of a gate electrode interconnection in the conventional semiconductor circuit, respectively.
Figure 15B:
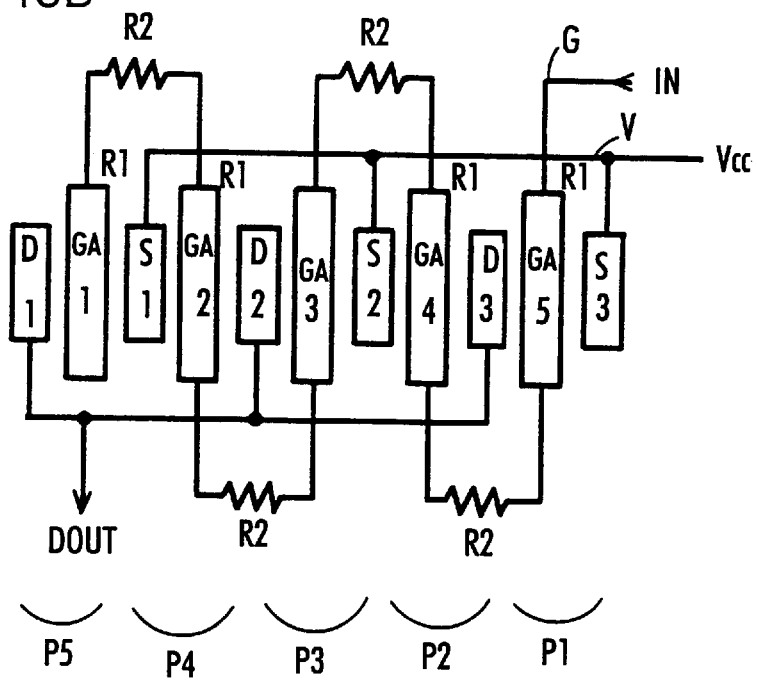

The structure of the gate electrode interconnections shown in FIG. 10 can be applied to the conventional output circuit shown in FIG. 11.

As described above, in accordance with the fourth embodiment, gate electrode layers are interconnected with interconnection layers having a higher resistance than that of the gate electrode layers, so that a desired propagation delay time of a signal can be set for each MOS transistor without an increase in area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit responsive to an input signal for driving an output node to a logic level corresponding to said input signal, comprising an output stage having:

a plurality of first transistors connected in parallel with each other between a reference node for supplying a first reference potential and an output signal line connected to said output node, and each rendered conductive when a signal of a first logic level is applied to a control electrode thereof;

a control electrode line interconnecting respective control electrodes of said plurality of first transistors;

a second transistor provided between said reference node and said control electrode line and rendered conductive when a signal of the first logic level is applied to a control electrode thereof; and means for providing a signal complementary to said input signal and applying one of the input signal and the complementary signal to the control electrode line of said plurality of first transistors and the other of the input signal and the complementary signal to the control electrode of said second transistor, respectively, wherein said plurality of first transistors include a plurality of control electrode layers each being elongated in configuration and having a predetermined resistance between opposite ends thereof and provided for respective control electrodes of said plurality of first transistors; and a plurality of interconnection layers interconnecting the plurality of control electrodes of the plurality of first transistors at the ends such that resistances thereof are in series, each of said plurality of interconnection layers being of a resistance between opposite ends thereof greater than that of each of said plurality of control electrode layers.

2. The semiconductor circuit according to claim 1, wherein said control electrode line comprises a plurality of resistance elements each connected between control electrodes of adjacent first transistors of said plurality of first transistors.

3. The semiconductor circuit according to claim 1, wherein said means includes an inverter for inverting said input signal for transmission onto said control electrode line, and a conductor line for transmitting said input signal to the control electrode of said second transistor.

4. The semiconductor circuit according to claim 1, wherein said reference node provides an operation power supply voltage at a second logic level.

5. The semiconductor circuit according to claim 4, wherein said plurality of first transistor and said second transistor each comprises a p channel insulated gate type field effect transistor.

6. The semiconductor circuit according to claim 1, wherein said reference node provides a ground potential at a second logic level.

7. The semiconductor circuit according to claim 6, wherein said plurality of first transistors and said second transistors each comprises an n channel insulated gate type field effect transistor.

8. A semiconductor circuit according to claim 1, further comprising:

a plurality of third transistors connected in parallel with each other between a second reference node for supplying a second reference potential and said output signal line connected to said output node, and each rendered conductive when a signal of a second logic level is applied to a control electrode thereof;

a second control electrode line having another redetermined resistance and interconnecting respective control electrodes of said plurality of third transistors;

a fourth transistor provided between said second reference node and said second control electrode line and rendered conductive when a signal of the second logic level is applied to a control electrode thereof; and second means for providing a signal complementary to said input signal and applying one of the input signal and the complementary signal to the control electrodes of said plurality of third transistors and the other of the input signal and the complementary signal to the control electrode of said fourth transistor, respectively.

9. The semiconductor circuit according to claim 1, wherein said second reference node supplies the second reference potential at the first logic level, and said reference node supplies the reference potential at the second logic level.

10. A semiconductor circuit, comprising;

a plurality of transistors connected in parallel with each other between a reference node for supplying a reference potential and an output signal line connected to an output node, each transistor having one conductive node connected to said reference node, another conductive node connected to said output signal line, and a control electrode, with each control electrode
  i) being formed of a first interconnection layer,
  ii) having a first end and an opposing second end between which the control electrode extends, and
  iii) having a first resistance between the first end and the second end, the control electrodes of the plurality of transistors being elongated in configuration and oriented in a common direction; and a plurality of interconnection lines perpendicular to and interconnecting the control electrodes of said plurality of transistors, wherein each control electrode has its first end and its second end each connected to a corresponding end of an adjacent control electrode to provide a single conductive path alternating in direction and with the control electrodes being sequentially arranged with interconnection lines interposed between adjacent control electrodes, respectively, each interconnection line having a second resistance between opposite ends thereof different from said first resistance, and wherein when a signal corresponding to an input signal is supplied through said single conductive path, each control electrode receives said input signal at one of its ends and sends out said input signal at its other end.

* * * * *